(12) United States Patent
Sakakibara

(10) Patent No.: US 11,456,044 B1
(45) Date of Patent: Sep. 27, 2022

(54) REVERSE VT-STATE OPERATION AND OPTIMIZED BICS DEVICE STRUCTURE

(71) Applicant: SANDISK TECHNOLOGIES LLC, Addison, TX (US)

(72) Inventor: Kiyohiko Sakakibara, Mie (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/199,245

(22) Filed: Mar. 11, 2021

(51) Int. Cl.
| G11C 16/04 | (2006.01) |
| G11C 16/08 | (2006.01) |
| G11C 16/24 | (2006.01) |
| G11C 16/26 | (2006.01) |
| G11C 16/34 | (2006.01) |
| G11C 16/14 | (2006.01) |
| G11C 16/30 | (2006.01) |

(52) U.S. Cl.
CPC ...... *G11C 16/3495* (2013.01); *G11C 16/0483* (2013.01); *G11C 16/14* (2013.01); *G11C 16/24* (2013.01); *G11C 16/26* (2013.01); *G11C 16/30* (2013.01); *G11C 16/3404* (2013.01)

(58) Field of Classification Search
CPC . G11C 16/3495; G11C 16/0483; G11C 16/14; G11C 16/24; G11C 16/26; G11C 16/30; G11C 16/3404
USPC .................................................... 365/185.22
See application file for complete search history.

(56) References Cited

U.S. PATENT DOCUMENTS

| 6,411,548 | B1 | 6/2002 | Sakui |
| 7,778,084 | B2 | 8/2010 | Kim et al. |
| 8,358,542 | B2 | 1/2013 | Radke et al. |
| 9,330,763 | B1 | 5/2016 | Zhang |
| 10,424,387 | B1* | 9/2019 | Zhang ............... G11C 16/0483 |
| 10,770,165 | B1 | 9/2020 | Cai et al. |
| 11,043,277 | B1* | 6/2021 | Pellizzer ............... G11C 16/30 |

(Continued)

OTHER PUBLICATIONS

Response to Office Action dated Nov. 4, 2021 in U.S. Appl. No. 17/173,023.US2.

(Continued)

*Primary Examiner* — Ly D Pham
(74) *Attorney, Agent, or Firm* — Vierra Magen Marcus LLP

(57) ABSTRACT

Systems and methods for improving the reliability of non-volatile memory by reducing the number of memory cell transistors that experience excessive hole injection are described. The excessive hole injection may occur when the threshold voltage for a memory cell transistor is being set below a particular negative threshold voltage. To reduce the number of memory cell transistors with threshold voltages less than the particular negative threshold voltage, the programmed data states of the memory cell transistors may be reversed such that the erased state comprises the highest data state corresponding with the highest threshold voltage distribution. To facilitate programming of the memory cell transistors with reversed programmed data states, a non-volatile memory device structure may be used in which the bit line connections to NAND strings comprise direct poly-channel contact to P+ silicon and the source line connections to the NAND strings comprise direct poly-channel contact to N+ silicon.

15 Claims, 20 Drawing Sheets

(56) References Cited

U.S. PATENT DOCUMENTS

| | | | |
|---|---|---|---|
| 2009/0109746 A1* | 4/2009 | Aritome | G11C 16/0483 |
| | | | 365/185.18 |
| 2013/0058165 A1 | 3/2013 | Maejima et al. | |
| 2014/0112075 A1 | 4/2014 | Dunga | |
| 2020/0043549 A1 | 2/2020 | Shibata | |
| 2020/0402582 A1* | 12/2020 | Yang | G06F 3/0679 |
| 2020/0411112 A1 | 12/2020 | Sakakibara | |
| 2020/0411115 A1 | 12/2020 | Sakakibara | |

OTHER PUBLICATIONS

Office Action dated Sep. 2, 2021 in U.S. Appl. No. 17/173,023.
Office Action dated Aug. 7, 2020, U.S. Appl. No. 16/456,036.
Response to Office Action dated Sep. 23, 2020, U.S. Appl. No. 16/456,036.
Office Action dated Oct. 28, 2020, U.S. Appl. No. 16/456,036.
Response to Office Action dated Dec. 8, 2020, U.S. Appl. No. 16/456,036.
Notice of Allowance dated Jan. 6, 2021, U.S. Appl. No. 16/456,036.
Notice of Allowance dated Jan. 6, 2021, U.S. Appl. No. 16/909,832.
Sakakibara, et al., "Boosting Read Scheme With Back-Gate Bias," U.S. Appl. No. 17/173,023, filed Feb. 10, 2021.
Notice of Allowance and Fee(s) Due dated Dec. 2, 2021 in U.S. Appl. No. 17/173,023.

* cited by examiner

Selected String During Read

$V_g$ | SGS | WLDS | WL$_{n-1}$ | WL$_n$ | WL$_{n+1}$ | WLDD | SGD
| 8V | 8V | 8V | Vr | 8V | 8V | 4V $V_s = 0.0\,V$ — N+ (816) — SL $V_d = 2.0\,V$ — P+ (812) — BL

Unselected String During Read

$V_g$ | SGS | WLDS | WL$_{n-1}$ | WL$_n$ | WL$_{n+1}$ | WLDD | SGD
| 0V | 0V | 0V | 0V | 0V | 0V | 0V $V_s = 0.0\,V$ — N+ (826) — SL $V_d = 2.0\,V$ — P+ (824) — BL

FIG. 8E

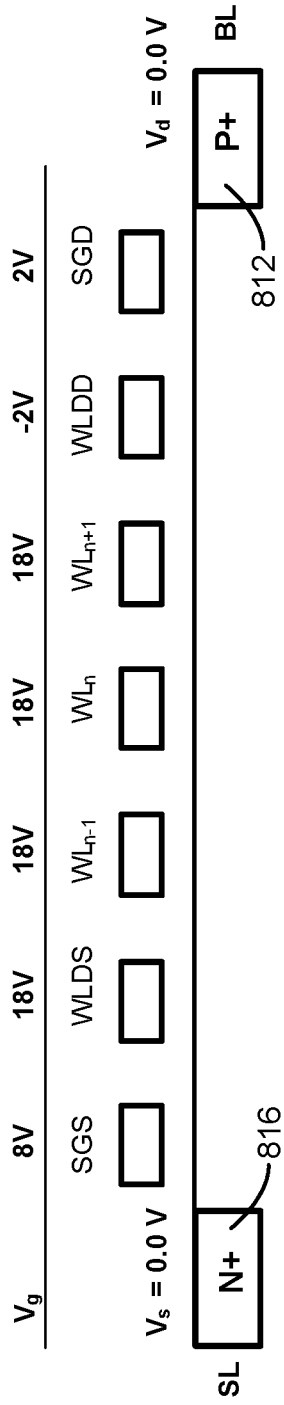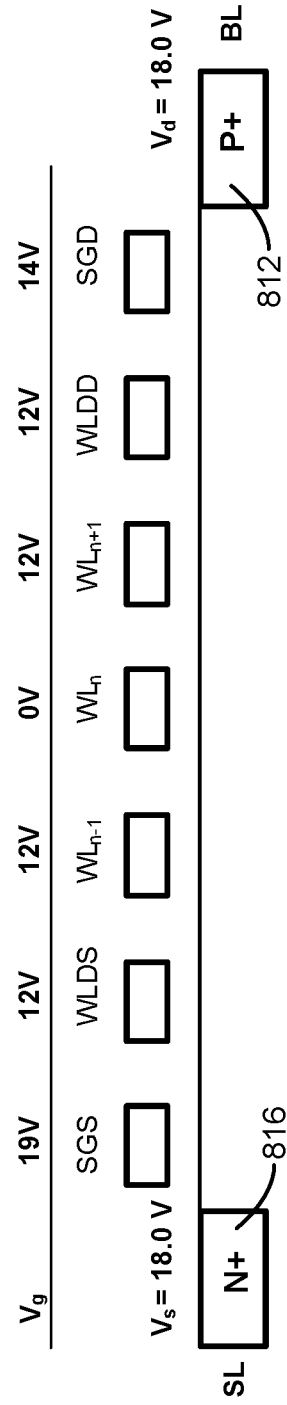
FIG. 8F
FIG. 8G

US 11,456,044 B1

REVERSE VT-STATE OPERATION AND OPTIMIZED BICS DEVICE STRUCTURE

BACKGROUND

The growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives (SSDs). Semiconductor memory devices may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM may utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or a memory cell transistor. In some cases, more than one data bit per memory cell transistor (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates (e.g., the source-side select gate and the drain-side select gate) may be referred to as a NAND string. In recent years, NAND flash memory has been scaled to reduce cost per bit. However, as process geometries shrink, many design and process challenges are presented. These challenges include increased neighboring word line to word line interference and reduced data retention over program/erase cycles.

BRIEF DESCRIPTION OF THE DRAWINGS

Like-numbered elements refer to common components in the different figures.

FIG. 8D depicts one embodiment of a side profile of a NAND string during a read operation.

FIG. 8E depicts one embodiment of a side profile of an unselected NAND string during a read operation in which the unselected NAND string has been set into an unselected state.

FIG. 8F depicts one embodiment of a side profile of the NAND string depicted in FIG. 8D during an erase operation.

FIG. 8G depicts one embodiment of a side profile of the NAND string depicted in FIG. 8D during a programming operation.

DETAILED DESCRIPTION

Figure 1:
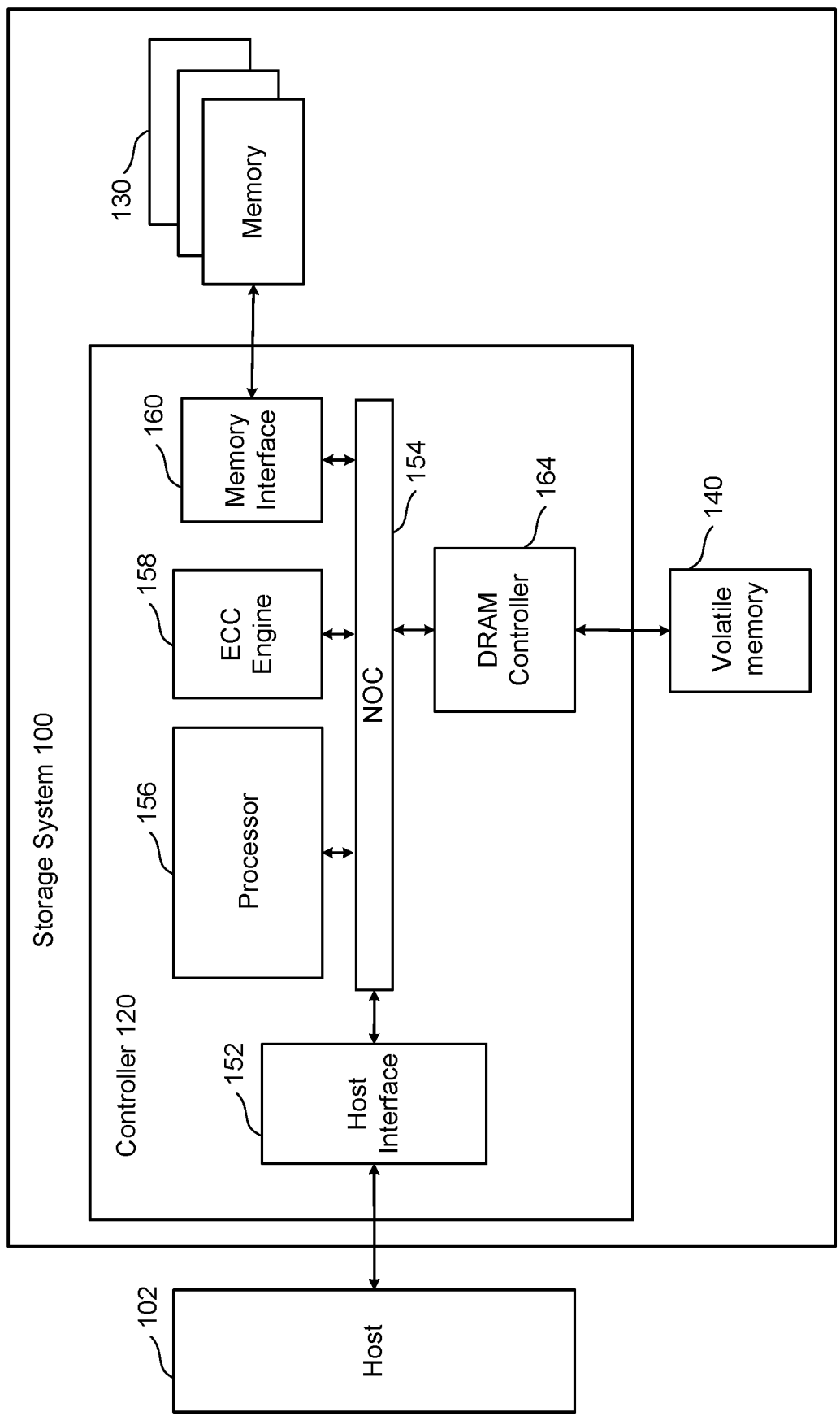
FIG. 1 is a block diagram depicting one embodiment of a memory system.

Technology is described for reducing manufacturing costs and improving the reliability of non-volatile memory by reducing the number of memory cell transistors that experience excessive hole injection during memory operations. The memory operations may comprise erase operations or programming operations. The memory cell transistors may comprise floating-gate or charge trap transistors within NAND strings (e.g., vertical or horizontal NAND strings with silicon-based or polysilicon channels) of the non-volatile memory. The excessive hole injection may occur during a memory operation when the threshold voltage for a memory cell transistor is being set below a particular negative threshold voltage (e.g., to a threshold voltage that is less than −2V). To reduce the number of memory cell transistors with threshold voltages less than the particular negative threshold voltage (e.g., less than −2V), the programmed data states of the memory cell transistors may be reversed such that the erased state comprises the highest data state corresponding with the highest threshold voltage distribution and the G state for a three bit per cell non-volatile memory (or the C state for a two bit per cell non-volatile memory) comprises the lowest data state with the lowest threshold voltage distribution. In some cases, two or more of the programmed data states that do not comprise the erased state may correspond with negative threshold voltage distributions. In one example, the F state may correspond with a first threshold voltage distribution between −0.5V and −1.5V, the G state may correspond with a second threshold voltage distribution between −2.0V and −3.0V, and the erased state may correspond with a third threshold voltage distribution between 5V and 7V. A technical benefit of reversing the programmed data states is that fewer memory cell transistors within a non-volatile memory may be set to threshold voltages less than the particular negative threshold voltage in which excessive holes are injected into the tunneling dielectric layers of the memory cell transistors leading to degradation of the tunneling dielectric layer and reduced data retention over program/erase cycles.

To facilitate programming of the memory cell transistors with reversed programmed data states, a non-volatile memory device structure in which the bit line connections to NAND strings comprise direct poly-channel contact to P+ silicon and the source line connections to the NAND strings comprise direct poly-channel contact to N+ silicon may be utilized. During a read operation, electrons may be injected from the N+ source line connection and recombined at the P+ bit line connection. During a programming operation, holes may be injected from the P+ bit line connection to the tunneling dielectric layers to adjust the threshold voltages of the memory cell transistors.

One technical issue with using NAND strings that utilize p-type doped bit line connections and then biasing the bit lines to a read voltage (e.g., to 2V) during a read operation is that substantial leakage current may occur within unselected NAND strings within unselected memory blocks that are connected to the same bit lines as selected memory blocks. A memory block may include a plurality of NAND strings or NAND flash memory structures, such as vertical NAND structures or bit cost scalable (BiCS) NAND structures. As both source lines and bit lines may extend across both selected memory blocks and unselected memory blocks, unwanted channel current through the unselected NAND strings due to the forward bias applied to the p-type doped bit line connections may cause increased power consumption and reduced battery lifetime. To avoid the unwanted leakage currents through the NAND strings in unselected memory blocks, the threshold voltage levels of the drain-side select gates may be set to a negative threshold voltage (e.g., to a negative threshold voltage level that has an absolute voltage value that is greater than the positive bit line voltage applied to the bit lines during the read operation). One technical benefit of setting the threshold voltages of the drain-side select gates to a negative threshold voltage prior to the read operation is that the leakage currents through the unselected NAND strings may be significantly reduced.

In one embodiment, the threshold voltage of the drain-side select gate transistor may be set during testing or sorting of memory die (e.g., during wafer soft or die sort) and remain fixed during operating of the memory die. In other embodiments, the threshold voltage of the drain-side select gate transistor may be initially set during testing or sorting of memory die and then be dynamically adjusted over time on a per memory die basis or a per page basis based on chip temperature and/or the number of program/erase cycles. In one example, if the chip temperature is greater than a threshold temperature, then the threshold voltage of the drain-side select gate transistor may be reduced or made more negative (e.g., reduced from −2V to −3V). In another example, if the number of program/erase cycles for a particular page has exceeded a threshold number of cycles (e.g., is more than 25 cycles), then the threshold voltage of the drain-side select gate transistor may be reduced or made more negative (e.g., reduced from 1V to −1V). The threshold voltages of the drain-side select gate transistors may be adjusted over time based on the chip temperature and/or the number of program/erase cycles. In some cases, a control circuit may reduce the threshold voltages of the drain-side select gate transistors within unselected memory blocks if the chip temperature is greater than a threshold temperature or if the number of program/erase cycles for a particular page or memory block has exceeded a threshold number of cycles.

A NAND string may comprise a series of floating gate transistors or a series of charge trap transistors. A charge trap transistor may comprise a silicon-oxide-nitride-oxide-silicon (SONOS), a metal-oxide-nitride-oxide-silicon (MONOS), or a metal-aluminum oxide-nitride-oxide-silicon (MANOS) device. The silicon component may comprise polycrystalline silicon, the oxide component may comprise silicon dioxide, and the nitride component may comprise silicon nitride. A NAND string may include a polysilicon channel that is orthogonal to a substrate and connects to a source line at a source-side end of the NAND string. To reduce the likelihood of the polysilicon channel being cut-off or pinched near the source-side end of the NAND string or near the bottom of the vertically oriented NAND string, a thicker polysilicon channel may be formed near the source-side end of the NAND string while a thinner polysilicon channel may be formed for the remainder of the NAND string including the portion of the NAND string comprising the memory cell transistors. The thicker portion of the polysilicon channel and the thinner portion of the polysilicon channel may be formed simultaneously during the same polysilicon etch operation. The technical benefit of using a thinner polysilicon channel for the memory cell transistors is that a higher memory cell current may be achieved. The technical benefit of using a thicker polysilicon channel for the source-side select gate transistor or near the source-side end of the NAND string is that localized over-thinning of the polysilicon channel or channel cut-off may be prevented.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 1-2 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system may use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
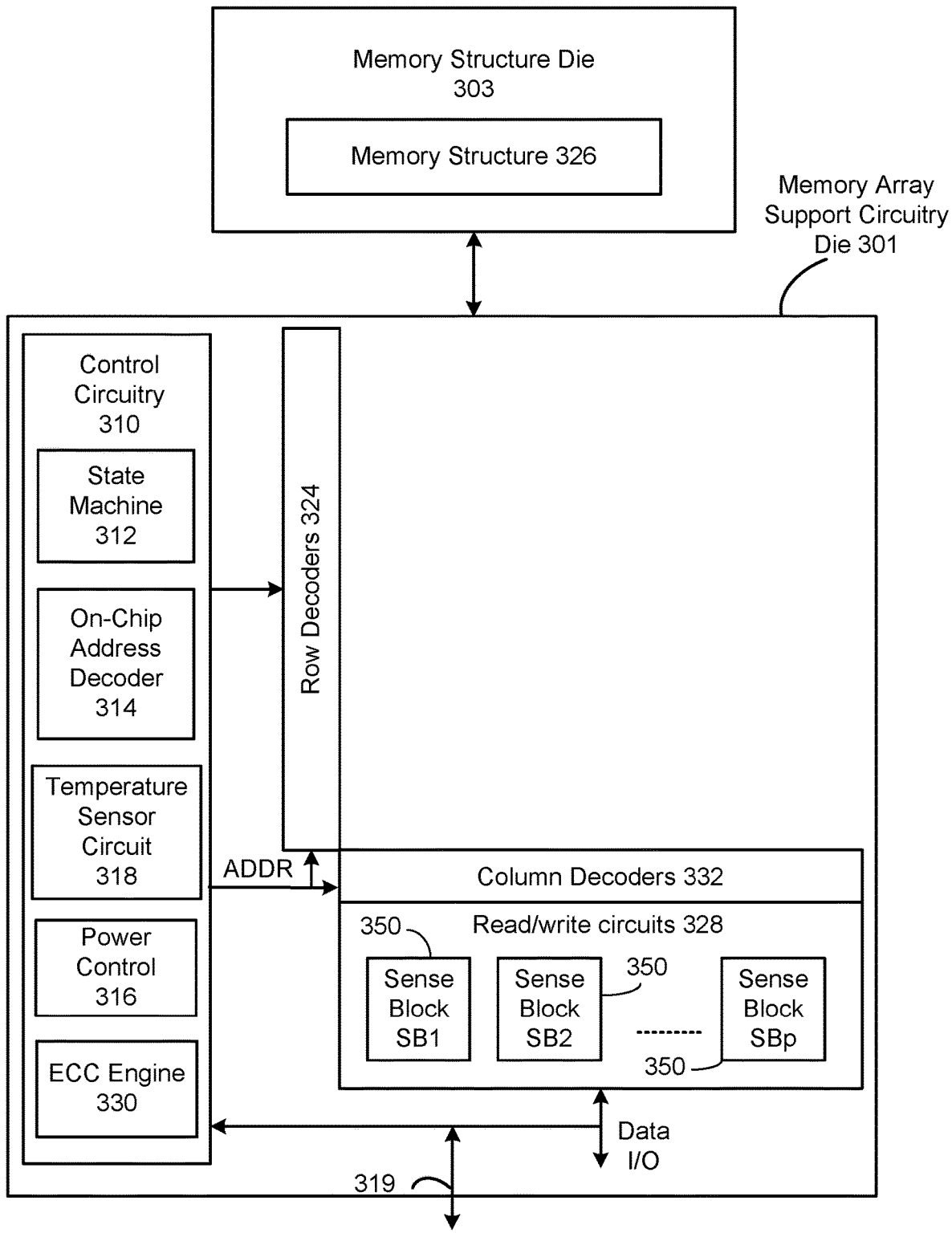
FIG. 2A depicts one embodiment of two separate die.

FIG. 2A depicts one embodiment in which elements of a memory system are grouped into two separate die comprising the memory structure die 303 (e.g., a die with only the memory array structures) and the memory array support circuitry die 301 (e.g., a die comprising the control circuits that facilitate memory operations for the memory structure 326). In some cases, the memory structure die 303 and the memory array support circuitry die 301 may be bonded together or arranged as a vertical stack of die within an integrated memory assembly. The memory structure die 303 may include non-volatile memory cells and the word lines and bit lines for accessing the non-volatile memory cells. The arrangement of the control circuits for performing memory operations (e.g., read and write operations) using the memory structure 326 on the memory array support circuitry die 301 allows the control circuits (e.g., row decoders, column decoders, and read/write circuits) to be fabricated using a different process technology compared with the process technology used for fabricating the memory structure die 303. Thus, the memory structure die 303 may be optimized for the memory array structure without worrying about the CMOS elements or control circuitry.

In some cases, the memory structure 326 can be formed on one die, such as the memory structure die 303, and some or all of the peripheral circuitry elements, including one or more control circuits, can be formed on a separate die, such as the memory array support circuitry die 301. In one example, the memory structure die 303 can be formed of just a memory array of memory elements, such as an array of memory cells of flash NAND memory, PCM memory, or ReRAM memory. In some cases, each of the one or more memory die 130 of FIG. 1 may correspond with the memory structure die 303 of FIG. 2A.

In reference to FIG. 2A, the word lines within the memory structure 326 may be biased by the row decoders 324 within the memory array support circuitry die 301 and the bit lines within the memory structure 326 may be biased by the column decoders 332 within the memory array support circuitry die 301. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block includes a sense amplifier and a set of latches. The latches store data to be written and/or data that has been read. Commands and data may be transferred between a controller, such as controller 120 in FIG. 1, and the memory array support circuitry die 301 via lines 319.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316, a temperature sensor circuit 318, and an ECC engine 330. The ECC engine 330 may generate ECC codes for protecting data to be stored within the memory structure 326. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects a die temperature for the memory array support circuitry die 301.

In some embodiments, one or more of the components (alone or in combination) within the memory array support circuitry die 301 may be referred to as a managing or control circuit. For example, one or more managing or control circuits may include any one of or a combination of control circuitry 310, state machine 312, decoder 314, power control 316, sense blocks 350, or read/write circuits 328. The one or more managing circuits or the one or more control circuits may perform or facilitate one or more memory array operations including erasing, programming, or reading operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 may be arranged in vertical NAND strings. In another embodiment, memory structure 326 comprises a two dimensional memory array of non-volatile memory cells. In one example, the non-volatile memory cells are NAND flash memory cells utilizing floating gates.

The exact type of memory array architecture or memory cell included in memory structure 326 is not limited to the examples above. Many different types of memory array architectures or memory cell technologies can be used to form memory structure 326. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
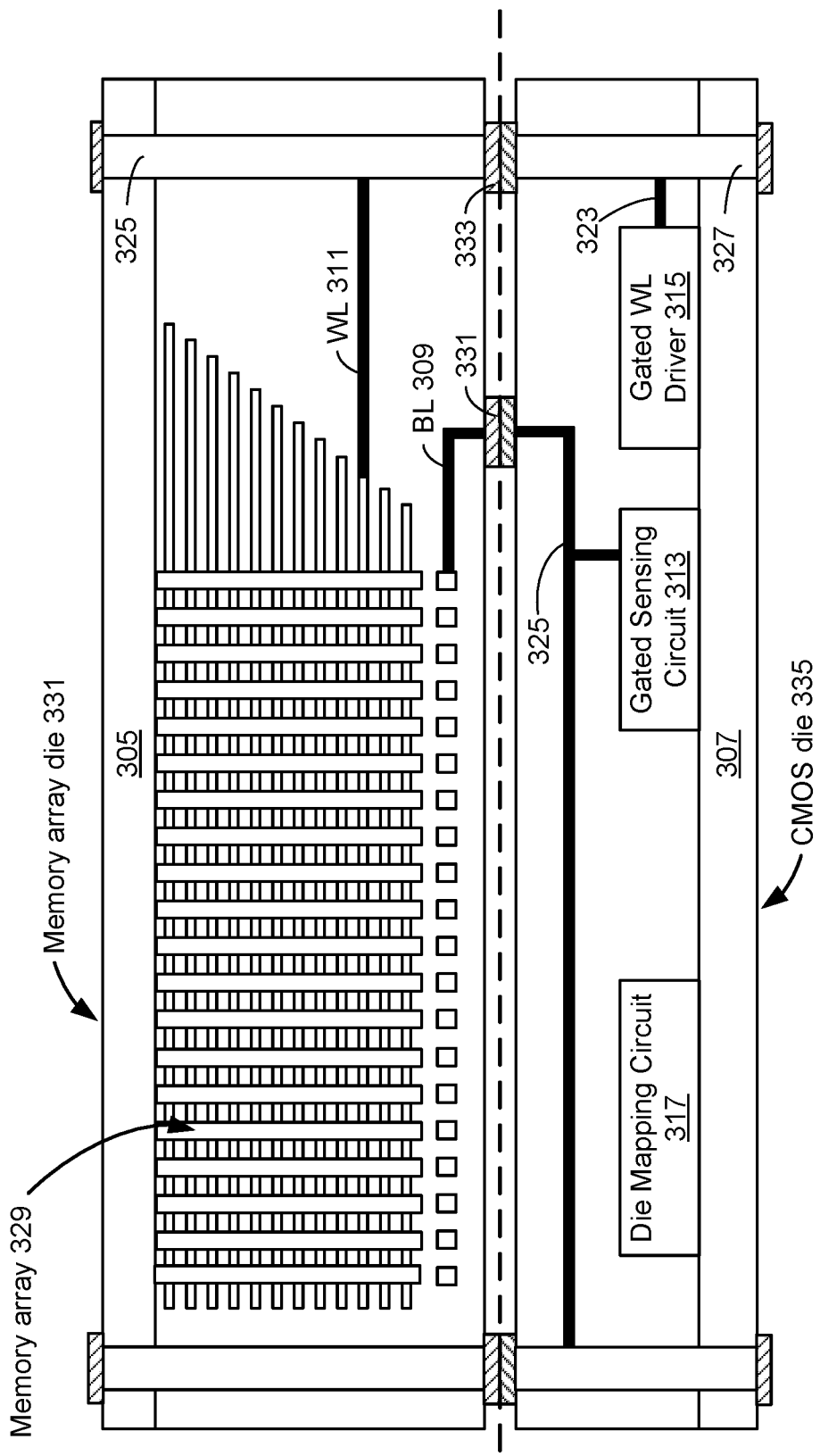
FIG. 2B depicts one embodiment of a plurality of stacked die that includes a memory array die and a CMOS die.

FIG. 2B depicts one embodiment of a plurality of stacked die that includes memory array die 331 and CMOS die 335. The memory array die 331 may correspond with the memory structure die 303 in FIG. 2A. The CMOS die 335 may correspond with the memory array support circuitry die 301 in FIG. 2A. As depicted in FIG. 2B, the memory array die 331 has been positioned above and bonded to the CMOS die 335. The memory array die 331 includes a memory array 329 comprising a plurality of memory cells. In one example, the memory array 329 may comprise a plurality of vertical NAND strings. The CMOS die 335 also includes a die mapping circuit 317 for mapping or electrically connecting one or more CMOS die within the plurality of stacked die with one or more memory array die within the plurality of stacked die. The die mapping circuit 317 may cause the gated sensing circuit 313 to be electrically connected to the bit line connection 325 or to be electrically disconnected from the bit line connection 325. The die mapping circuit 317 may cause the gated word line WL driver 315 to be electrically connected to the word line connection 323 or to be electrically disconnected from or cut off from the word line connection 323.

The CMOS die 335 also includes gated sensing circuit 313 and gated word line WL driver 315. The gated sensing circuit 313 may comprise a set of sense amplifiers (or a set of read/write circuits such as read/write circuits 328 in FIG. 2A) in series with an analog multiplexor or other gating transistors that may cut off the gated sensing circuit 313 from the bit line connection 325. As the bit line connection 325 has been connected to the bit line BL 309 of the memory array die 301 via bond pad 331, if the set of sense amplifiers within the gated sensing circuit 313 is electrically connected to the bit line connection 325, then the set of sense amplifiers may bias the bit line BL 309 connected to the memory array 329 and sense current from memory cells within the memory array 329. However, if sense amplifiers from another CMOS die not depicted are instead electrically connected to the bit line connection 325, then the gated sensing circuit 313 will prevent the set of sense amplifiers from being electrically connected to the bit line connection 325.

The gated word line WL driver 315 may comprise a set of word line drivers (or last stage row decoders) in series with an analog multiplexor or other gating transistors that may cut off or electrically disconnect the gated word line WL driver 315 from the word line connection 323. As the word line connection 323 has been connected to the word line WL 311 of the memory array 329, if the set of word line drivers within the gated word line WL driver 315 is electrically connected to the word line connection 323, then the set of word line drivers may drive or bias the word line WL 311 connected to the memory array 329. However, if word line drivers from another CMOS die not depicted are instead electrically connected to the word line WL 311 connected to the memory array 329, then the gated word line WL driver 315 will prevent the set of word line drivers within the gated word line WL driver 315 from being electrically connected to the word line connection 323. Both the word line connection 323 and the word line WL 311 connected to the memory array 329 are electrically connected to a portion of a vertical TSV bus that includes a first TSV 325 that extends through a substrate 305 of the memory array die 331 and a second TSV 327 that extends through a substrate 307 of the CMOS die 335. The portion of the vertical TSV bus may allow other die not depicted arranged above or below the memory array die 331 to electrically connect to the word line WL 311.

Figure 3A:
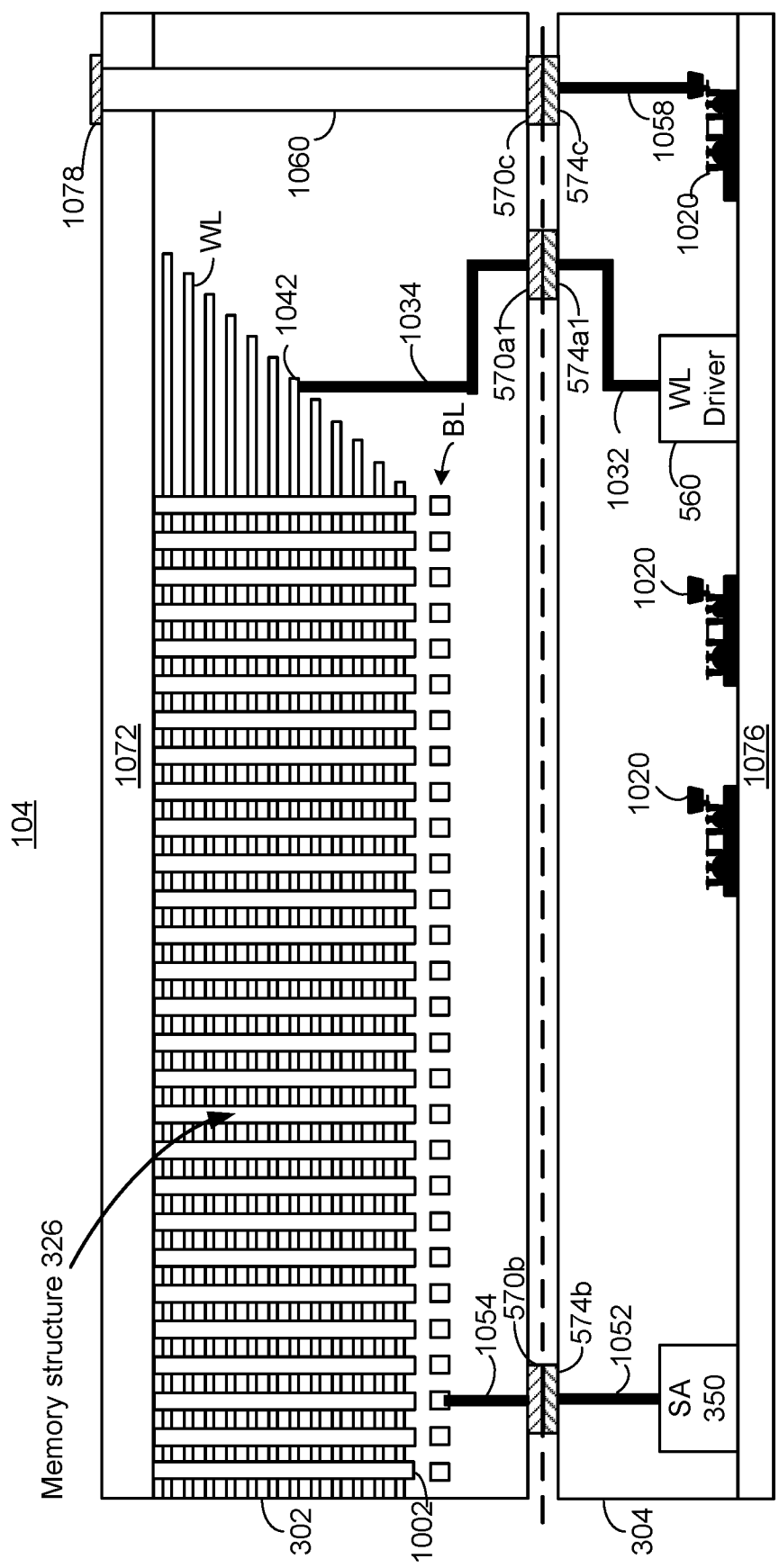
FIGS. 3A-3B depict various embodiments of an integrated memory assembly.

FIG. 3A depicts one embodiment of an integrated memory assembly 104. As depicted, the memory die 302 is bonded to control die 304. Note that although a gap is depicted between the pair of adjacent die, such a gap may be filled with an epoxy or other resin or polymer. The memory die 302 includes a memory structure 326. Memory structure 326 may be fabricated on substrate 1072 of memory die 302. The substrate 1072 may be formed from a portion of a silicon wafer, in some embodiments. The memory structure 326 may comprise a three-dimensional memory array or an array of vertical NAND strings. As depicted, the memory structure 326 may include a number of word line (WL) layers and bit line (BL) layers. The word line layers may be separated by dielectric layers. The dielectric layers are represented by gaps between the word line layers. There are a number of columns that extend through the stack of word line layers. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The conductive pathway from the word line driver 560 to the word line 1042 includes conductive pathway 1032, bond pad 574a1, bond pad 570a1, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 3A) provide voltages to other word lines. Thus, there are additional bond pad 574a, 570a in addition to bond pads 574a1, 570a1. The bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including aluminum, tungsten, and copper and the vias may be lined and/or filled with a variety of electrically conductive metals including tungsten, copper and copper alloys. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310 depicted in FIG. 2A. In some embodiments, sense amplifiers 350, word line driver(s) 560, and/or other circuitry 1020 comprise CMOS circuits.

There may be an external signal path that allows circuitry on the control die 304 to communicate with an entity external to the integrated memory assembly 104, such as memory controller 102 in FIG. 1. Therefore, circuitry 1020 on the control die 304 may communicate with controller 102. The external pathway includes via 1058 in control die 304, bond pad 574c, bond pad 570c, through silicon via (TSV) 1060, and external pad 1078. The TSV 1060 extends through substrate 1072. The TSV 1060, may be formed before, during or after formation of the integrated circuits in the semiconductor die 302, 304. The TSV may be formed by etching holes through the wafers. For example, holes may be etched through substrate 1072.

Figure 3B:
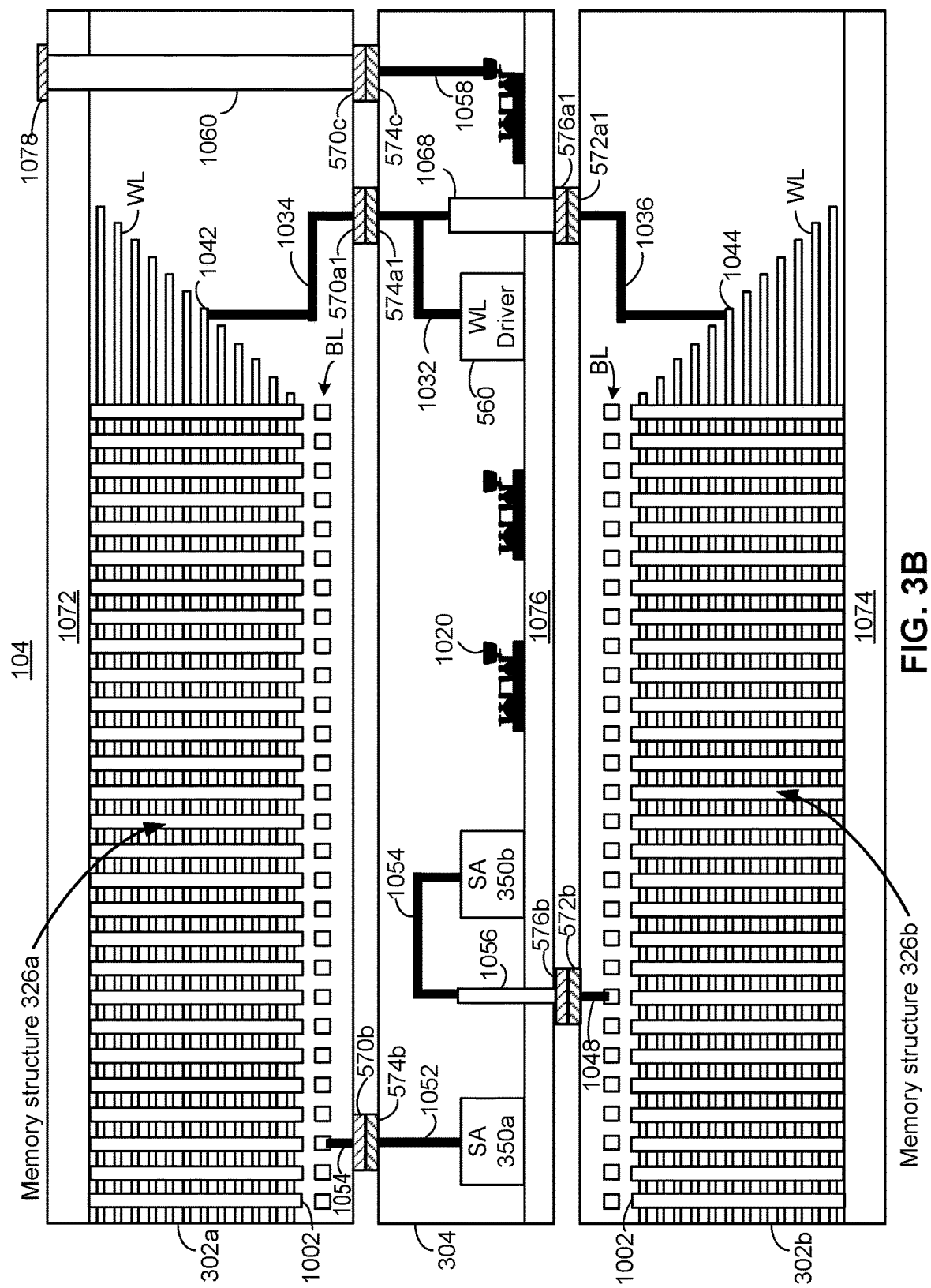

FIG. 3B depicts another embodiment of an integrated memory assembly 104. The configuration in FIG. 3B adds an extra memory die relative to the configuration depicted in FIG. 3A. Hence, similar reference numerals are used for memory die 302*a* in FIG. 3B as were used for memory die 302 in FIG. 3A. In one embodiment, first memory die 302*a* is bonded to control die 304, and control die 304 is bonded to second memory die 302*b*. Note that although a gap is depicted between the pairs of adjacent die, such a gap may be filled with an epoxy or other resin or polymer.

Each memory die 302*a*, 302*b* includes a memory structure 326. Memory structure 326*a* is adjacent to substrate 1072 of memory die 302*a*. Memory structure 326*b* is adjacent to substrate 1074 of memory die 302*b*. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302*a* and a second word line 1044 in memory die 302*b*. The pathway from the word line driver 560 to the second word line 1044 includes conductive pathway 1032, through silicon via (TSV) 1068, bond pad 576*a*1, bond pad 572*a*1, and conductive pathway 1036. Other word line drivers (not depicted in FIG. 3B) provide voltages to other word lines.

Sense amplifier 350*a* is in communication with a bit line in memory die 302*a*. The pathway from the sense amplifier 350*a* to the bit line includes conductive pathway 1052, bond pad 574*b*, bond pad 570*b*, and conductive pathway 1054. Sense amplifier 350*b* is in communication with a bit line in memory die 302*b*. The pathway from the sense amplifier 350*b* to the bit line includes conductive pathway 1054, TSV 1056, bond pad 576*b*, bond pad 572*b*, and conductive pathway 1048. Numerous modification to an embodiment depicted in FIG. 3B are possible One modification is for sense amplifiers 350*a* to be located on first memory die 302*a*, and for sense amplifiers 350*b* to be located on second memory die 302*b*.

Figure 4:
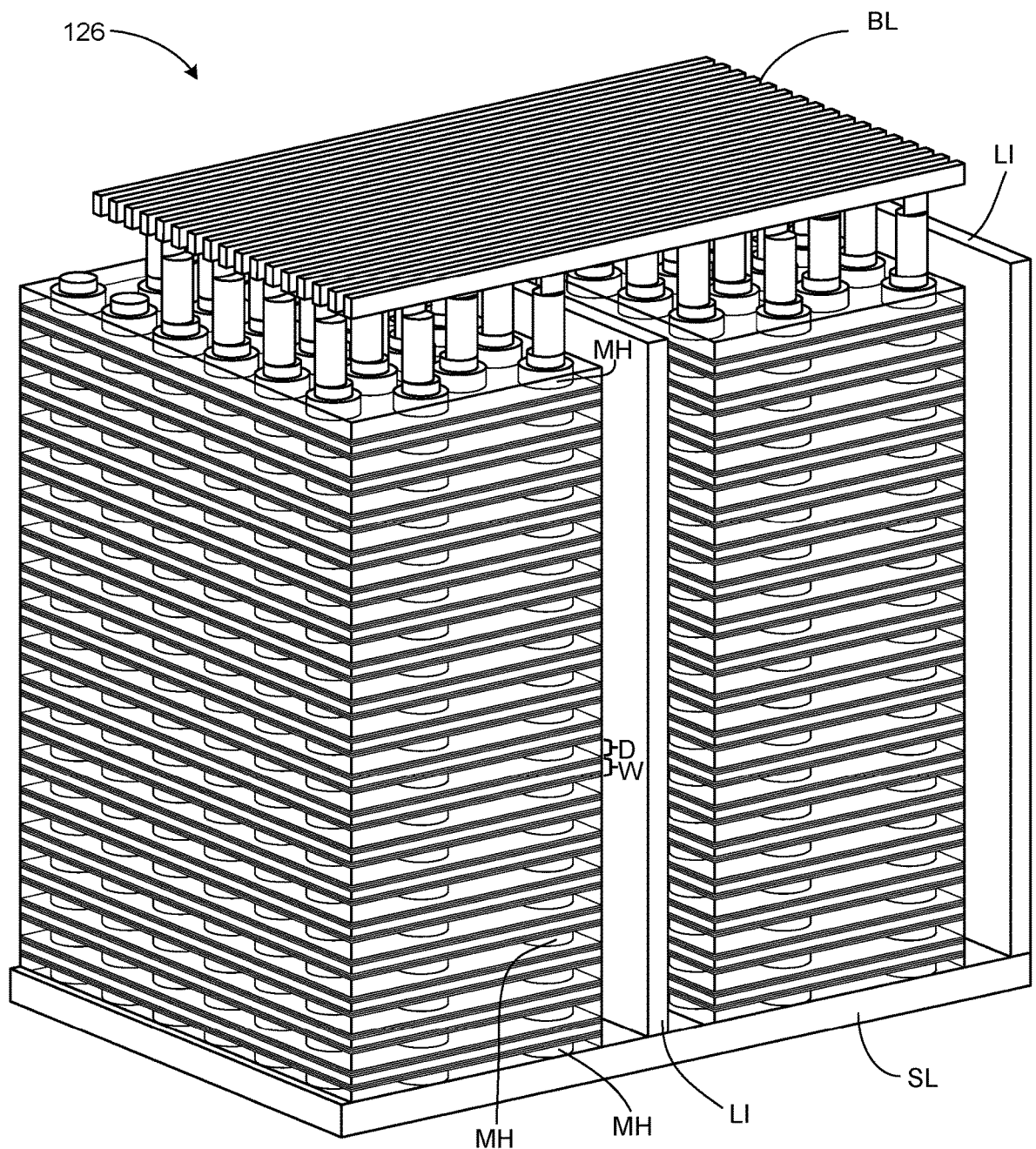
FIG. 4 is a perspective view of a portion of one embodiment of a monolithic three dimensional memory structure.

FIG. 4 is a perspective view of a portion of one example embodiment of a monolithic three dimensional memory array that can comprise memory structure 326, which includes a plurality non-volatile memory cells arranged as vertical NAND strings. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 4 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

Figure 5:
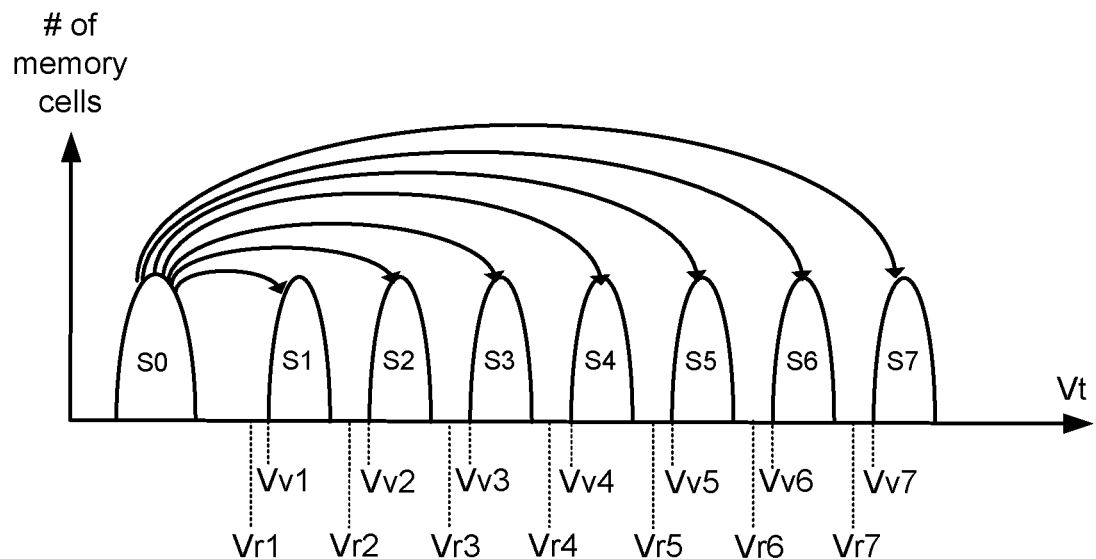
FIG. 5 depicts threshold voltage distributions.

The memory systems discussed herein can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data state S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

Figure 6:
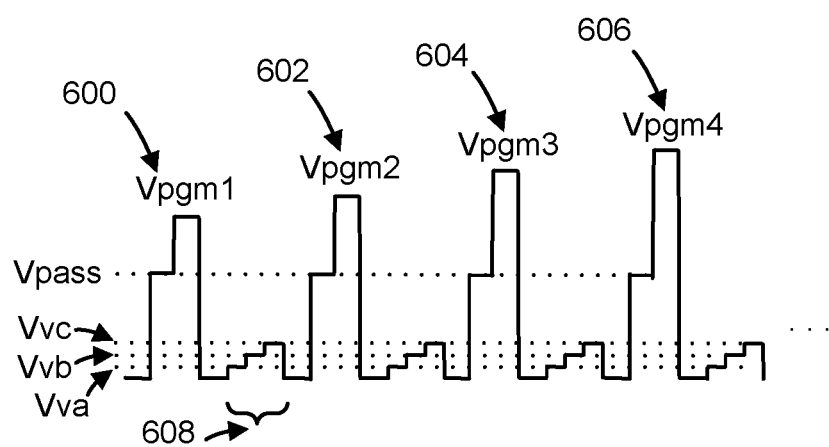
FIG. 6 depicts one embodiment of a series of program and verify pulses which are applied to a selected word line during a programming operation.

FIG. 6 depicts one embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line. In one embodiment, the programming pulses are stepped up in successive iterations. Moreover, each programming pulse may include a first portion which has a pass voltage (Vpass) level, e.g., 6-8 V, followed by a second, highest amplitude portion at a programming voltage (Vpgm) level, e.g., 12-25 V. For example, as depicted in FIG. 6, a first, second, third, and fourth programming pulses 800, 802, 804 and 806 have programming voltage levels of Vpgm1, Vpgm2, Vpgm3 and Vpgm4, respectively. One or more verify voltages 808, such as verify voltages Vva, Vvb and Vvc, may be provided after each programming pulse. In some cases, one or more initial programming pulses are not followed by verify pulses because it is not expected that any storage elements could have reached the lowest program state (e.g., A-state). Subsequently, in some cases, programming iterations may use verify pulses for the A-state, followed by programming iterations which use verify pulses for the A-states and B-states, followed by programming iterations which use verify pulses for the B-states and C-states.

Figure 7:
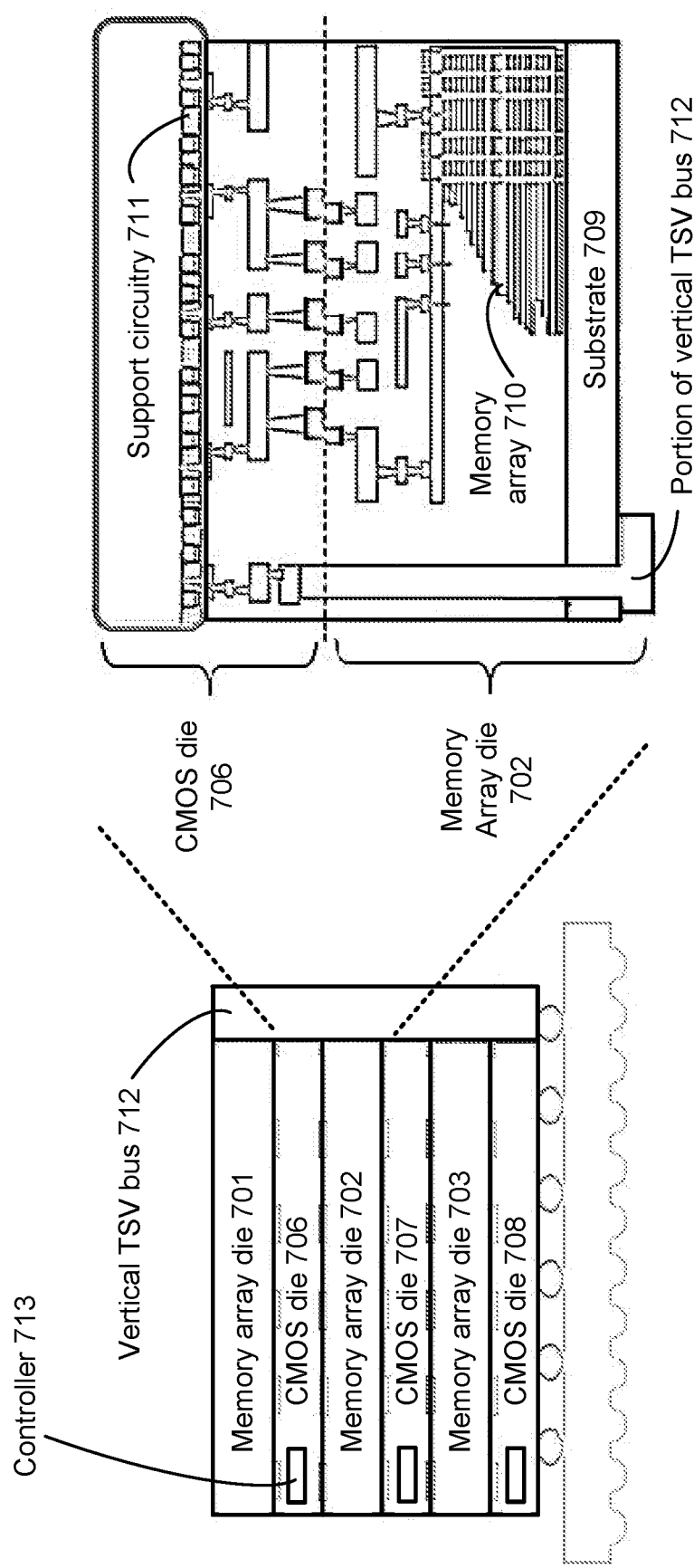
FIG. 7 depicts one embodiment of a plurality of stacked die.

FIG. 7 depicts one embodiment of a plurality of stacked die. As depicted, the plurality of stacked die includes memory array die 701-703 and CMOS die 706-708 interdigitated in a vertical stack. The CMOS die 706-708 may include CMOS circuitry for controlling various memory operations performed using the memory array die 701-703. The CMOS die 706 includes a controller 713, which may comprise a die mapping controller for assigning one or more CMOS die within the plurality of stacked die to one or more of the memory array die within the plurality of stacked die. In one example, the controller 713 may correspond with die mapping circuit 317 in FIG. 2B. Each die of the plurality of stacked die may be in communication with the other die of the plurality of stacked die via a vertical TSV bus 712. The vertical TSV bus 712 may comprise configurable electrical connections that span the length of the stacked die and may include through-silicon vias through each of the memory array die 701-703. The configurable electrical connections may utilize a crossbar structure or transistor-based multiplexors.

The CMOS die 706 may be flipped such that its substrate is positioned above the interconnect layers for the CMOS die 706 and then positioned above and connected to the memory array die 702. Some of the memory array die and CMOS die may utilize a flip chip pairing with the active elements of the support circuitry 711 positioned above the interconnections for the CMOS die 706 and the memory array 710 (e.g., comprising vertical NAND strings) positioned above the substrate 709 for the memory array die 702. An electrical connection comprising a portion of the vertical TSV bus 712 may extend from the CMOS die 706 through the substrate 709 of the memory array die 702 using a TSV. The portion of the vertical TSV bus 712 may connect to support circuitry for the CMOS die 707, which may then extend from the CMOS die 707 through the substrate of the memory array die 703 using another TSV. Although the vertical TSV bus 712 is depicted as extending along one side of the plurality of stacked die, other vertical TSV busses or electrical connections may extend through a middle portion of the stacked die.

The support circuitry 711 may comprise sense amplifiers and data latches for storing data read from the memory array 710. The support circuitry 711 may also include voltage regulators for generating voltages to be applied to the data latches over time. For example, the support circuitry 711 may generate a bulk voltage (e.g., 0V or −1V) to be applied to the PWELL bodies of low VT NMOS transistors within the data latches as well as a source voltage (e.g., 0.7V or 0V) to be applied to the sources of the low VT NMOS transistors within the data latches. An analog multiplexor may be used to select between the various regulated voltage levels such that 0V is applied to the sources of the low VT NMOS transistors within the data latches when new data is being latched and 0.7V is applied to the sources of the low VT NMOS transistors after the new data has been latched.

Figure 8A:
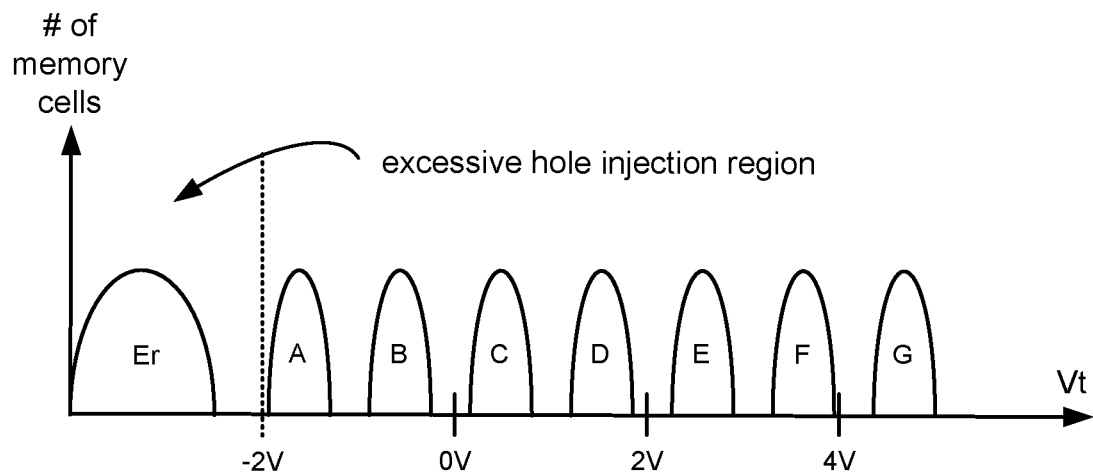
FIG. 8A depicts one embodiment of eight data state distributions associated with a three bit per cell non-volatile memory.

FIG. 8A depicts one embodiment of eight data state distributions associated with a three bit per cell non-volatile memory. FIG. 8A may comprise one example of the data states depicted in FIG. 5. As depicted in FIG. 8A, the erased state distribution (Er) corresponds with a threshold voltage distribution that is less than −2V, the A-state (A) and B-state (B) data states correspond with two threshold voltage distributions between −2V and 0V, the C-state (C) and D-state (D) data states correspond with two threshold voltage distributions between 0V and 2V, the E-state (E) and F-state (F) data states correspond with two threshold voltage distributions between 2V and 4V, and the G-state data state corresponds with a threshold voltage distribution that is greater than 4V. In this case, prior to a programming operation, all memory cell transistors within a memory block may be erased or set into the erased state distribution (Er). Therefore, all the memory cell transistors within the memory block may experience excessive hole injection during the erase operation.

Figure 8B:
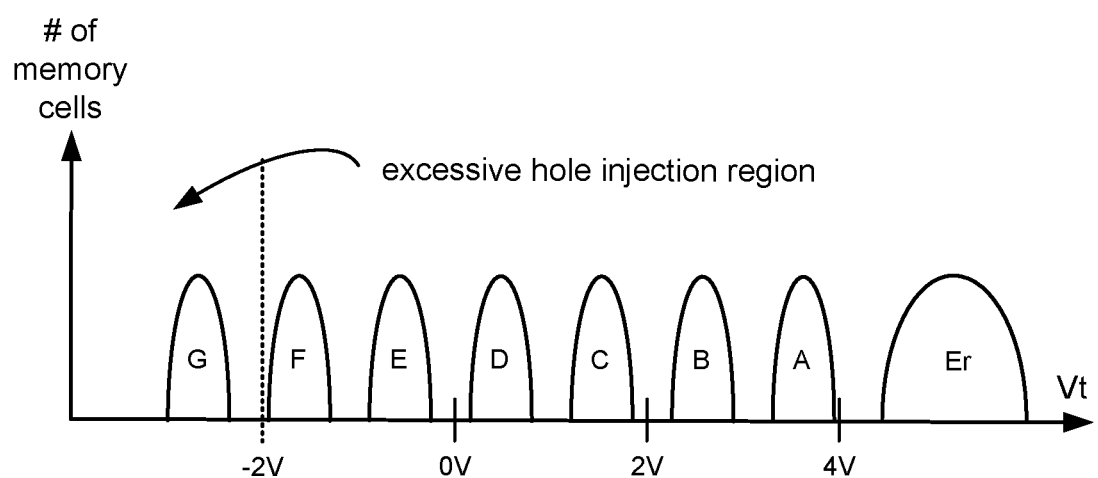
FIG. 8B depicts one embodiment of eight data state distributions associated with a three bit per cell non-volatile memory that correspond with reversed programmed data states.

FIG. 8B depicts one embodiment of eight data state distributions associated with a three bit per cell non-volatile memory that correspond with reversed programmed data states. As depicted, the erased state distribution (Er) corresponds with a threshold voltage distribution that is greater than 4V, the A-state (A) and B-state (B) data states correspond with two threshold voltage distributions between 2V and 4V, the C-state (C) and D-state (D) data states correspond with two threshold voltage distributions between 0V and 2V, the E-state (E) and F-state (F) data states correspond with two threshold voltage distributions between 0V and −2V, and the G-state data state corresponds with a threshold voltage distribution that is less than −2V. In this case, prior to a programming operation, all memory cell transistors within a memory block may be erased or set into the erased state distribution (Er) that is greater than 4V and only a fraction (e.g., one eighth) of the memory cell transistors may be subsequently programmed to the G-state data state that corresponds with a threshold voltage distribution that is less than −2V. Therefore, only a fraction of the memory cell transistors less than all of the memory cell transistors within a memory block may experience excessive hole injection during memory operations.

Figure 8C:
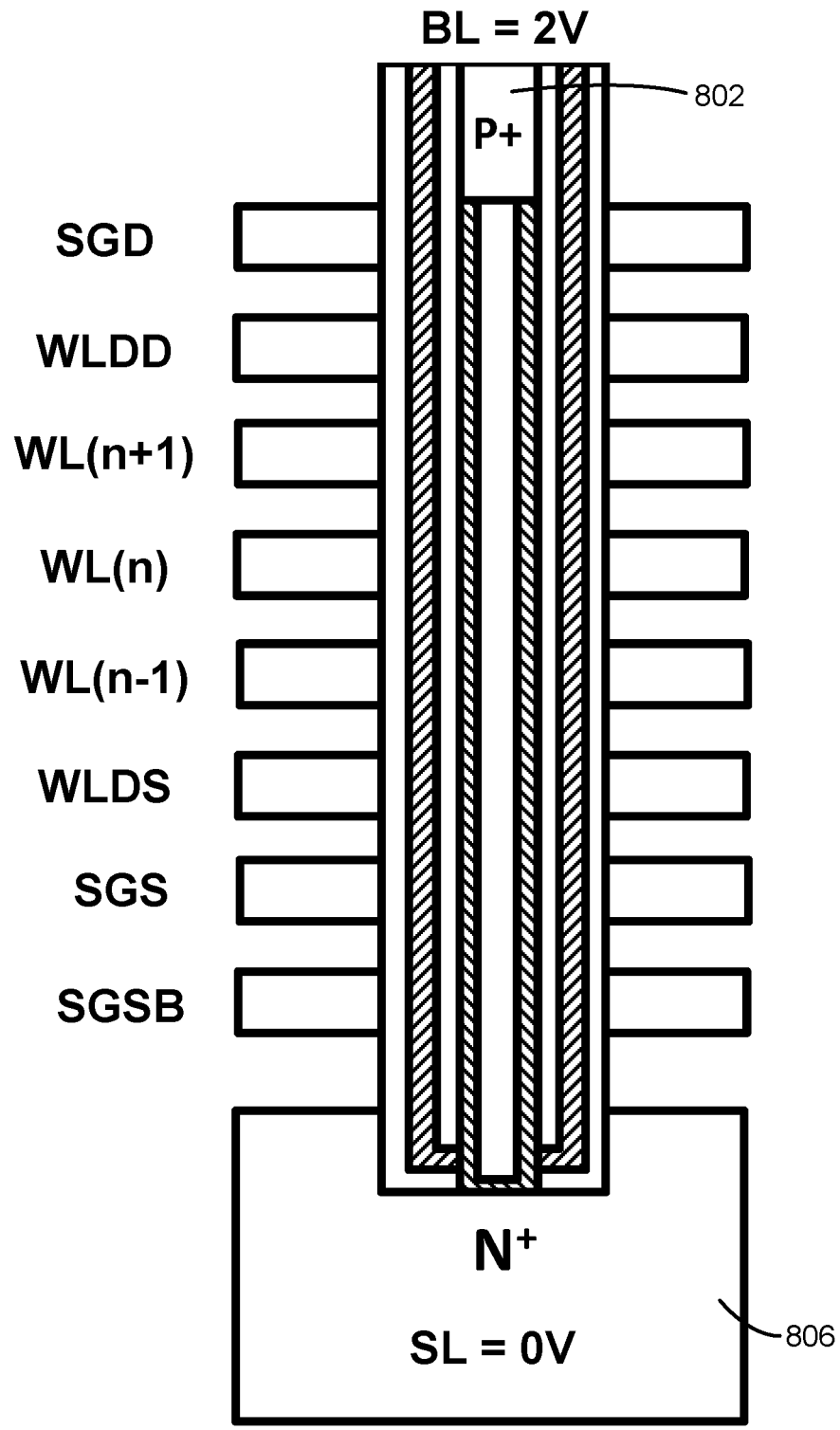
FIG. 8C depicts one embodiment of a vertical NAND string that includes an n-type doped source line and a p-type doped bit line during a read operation.

FIG. 8C depicts one embodiment of a vertical NAND string that includes an n-type doped source line and a p-type doped bit line during a read operation. The n-type doped source line may comprise a layer of n-type polysilicon that directly connects to a channel layer (e.g., an undoped polysilicon layer) of the vertical NAND string. The p-type doped bit line may comprise a layer of p-type polysilicon that directly connects to the channel layer of the vertical NAND string. As depicted in FIG. 8C, the vertical NAND string includes a drain-side select gate transistor controlled by the drain-side select gate line SGD, a drain-side dummy transistor controlled by the dummy word line WLDD, a plurality of memory cell transistors corresponding with word lines WL(n+1) through WL(n−1), a source-side dummy transistor controlled by the dummy word line WLDS, a first source-side select gate transistor controlled by the source-side select gate line SGS, and a second source-side select gate transistor controlled by the source-side select gate line SGSB. The drain-side select gate transistor connects to a bit line 802 and the source-side select gate transistor that is controlled by the source-side select gate line SGSB connects to a source line 806. The source line 806 may comprise phosphorus-doped silicon or phosphorus-doped polysilicon. The vertical NAND string may include a polysilicon channel that extends between the bit line 802 and the source line 806. The vertical NAND string may include a vertical charge trapping layer, a vertical MANOS layer, or a vertical TANOS layer arranged between the word lines and the polysilicon channel.

As depicted in FIG. 8C, the bit line 802 has been biased to a bit line voltage of 2V and the source line 806 has been biased to a source line voltage of 0V. In this case, the threshold voltage of the selected memory cell transistor connected to the selected word line WL(n) may be determined based on a read current that flows from the bit line 802 to discharge an integration capacitor or node within a sense amplifier electrically connected to the bit line 802. The sense amplifier may correspond with the read/write circuits 328 depicted in FIG. 2A. The loss of charge due to the read current may be sensed by the sense amplifier in order to determine a data state corresponding with the threshold voltage of the selected memory cell transistor. In some embodiments, the memory cell transistors of the vertical NAND string depicted in FIG. 8C may comprise a vertical string of charge trap transistors. In other embodiments, the memory cell transistors of the vertical NAND string may comprise a vertical string of floating gate transistors.

FIG. 8D depicts one embodiment of a side profile of a NAND string during a read operation. The NAND string includes an n-type source line 816 and a p-type bit line 812. In one example, the NAND string may correspond with the vertical NAND string depicted in FIG. 8C. As depicted, the source line 816 has been set to a source line voltage of 0V and the bit line 812 has been set to a bit line voltage of 2.0V. The unselected word lines corresponding with word lines WL(n−1) and WL(n+1) have been set to 8V (e.g., the Vread voltage), the drain-side select gate line SGD has been set to 4V, the drain-side dummy word line WLDD has been set to 8V, the source-side dummy word line WLDS has been set to 8V, the source-side select gate line SGS has been set to 8V, and the selected word line WL(n) that controls the control gate of the selected memory cell transistor has been set to a read bias voltage Vr (e.g., 3V or 3.5V). In this case, as the threshold voltage of the selected memory cell transistor is less than the read bias voltage Vr, a read current 814 flows from the bit line 812 to the source line 816.

FIG. 8E depicts one embodiment of a side profile of an unselected NAND string during a read operation, in which the unselected NAND string has been set into an unselected state. The unselected NAND string may be part of an unselected memory block. As depicted, the source line 826 has been set to a source line voltage of 0V and the bit line 824 has been set to a bit line voltage of 2.0V (e.g., due to a shared bit line connection with a selected NAND string in a selected memory block). The unselected word lines corresponding with word lines WL(n−1) and WL(n+1) have been set to 0V, the drain-side select gate line SGD has been set to 0V, the drain-side dummy word line WLDD has been set to 0V, the source-side dummy word line WLDS has been set to 0V, the source-side select gate line SGS has been set to 0V, and the unselected word line WL(n) has been set to 0V. In one embodiment, to reduce leakage current from the bit line 824 into the unselected NAND string, the threshold voltage of the drain-side select gate corresponding with the drain-side select gate line SGD may be set to a negative threshold voltage (e.g., −2V) to increase the barrier for holes. In some embodiments, a control circuit may determine that the bit line voltage applied to selected bit lines during a first read operation will be a first voltage (e.g., 3.0V) and in response the control circuit may cause the threshold voltages of drain-side select gate transistors to be set to a negative threshold voltage that has an absolute value that is greater than the first voltage (e.g., −3.2V).

FIG. 8F depicts one embodiment of a side profile of the NAND string depicted in FIG. 8D during an erase operation. As depicted, the source line 816 has been set to a source line voltage of 0V and the bit line 812 has been set to a bit line voltage of 0V. The unselected word lines corresponding with word lines WL(n−1) and WL(n+1) have been set to 18V (e.g., the erase voltage), the drain-side select gate line SGD has been set to 2V, the drain-side dummy word line WLDD has been set to −2V, the source-side dummy word line WLDS has been set to 18V, the source-side select gate line SGS has been set to 8V, and the word line WL(n) has been set to 18V. In this case, the threshold voltages of the memory cell transistors corresponding with word lines WL(n), WL(n−1), and WL(n+1) may be set into the erased state distribution corresponding with a threshold voltage distribution greater than 4V. In one example, the erased state distribution may correspond with the erased state distribution Er depicted in FIG. 8B.

FIG. 8G depicts one embodiment of a side profile of the NAND string depicted in FIG. 8D during a programming operation. As depicted, the source line 816 has been set to a source line voltage of 18V and the bit line 812 has been set to a bit line voltage of 18V. The unselected word lines corresponding with word lines WL(n−1) and WL(n+1) have been set to 12V, the drain-side select gate line SGD has been set to 14V, the drain-side dummy word line WLDD has been set to 12V, the source-side dummy word line WLDS has been set to 12V, the source-side select gate line SGS has been set to 19V, and the selected word line WL(n) has been set to 0V. In this case, the threshold voltage of the selected memory cell transistor corresponding with the selected word line WL(n) may be programmed to a data state associated with a threshold voltage distribution that is less than the erased state distribution. In one example, the threshold voltage of the selected memory cell transistor may be set to the E-state depicted in FIG. 8B.

Figure 9A:
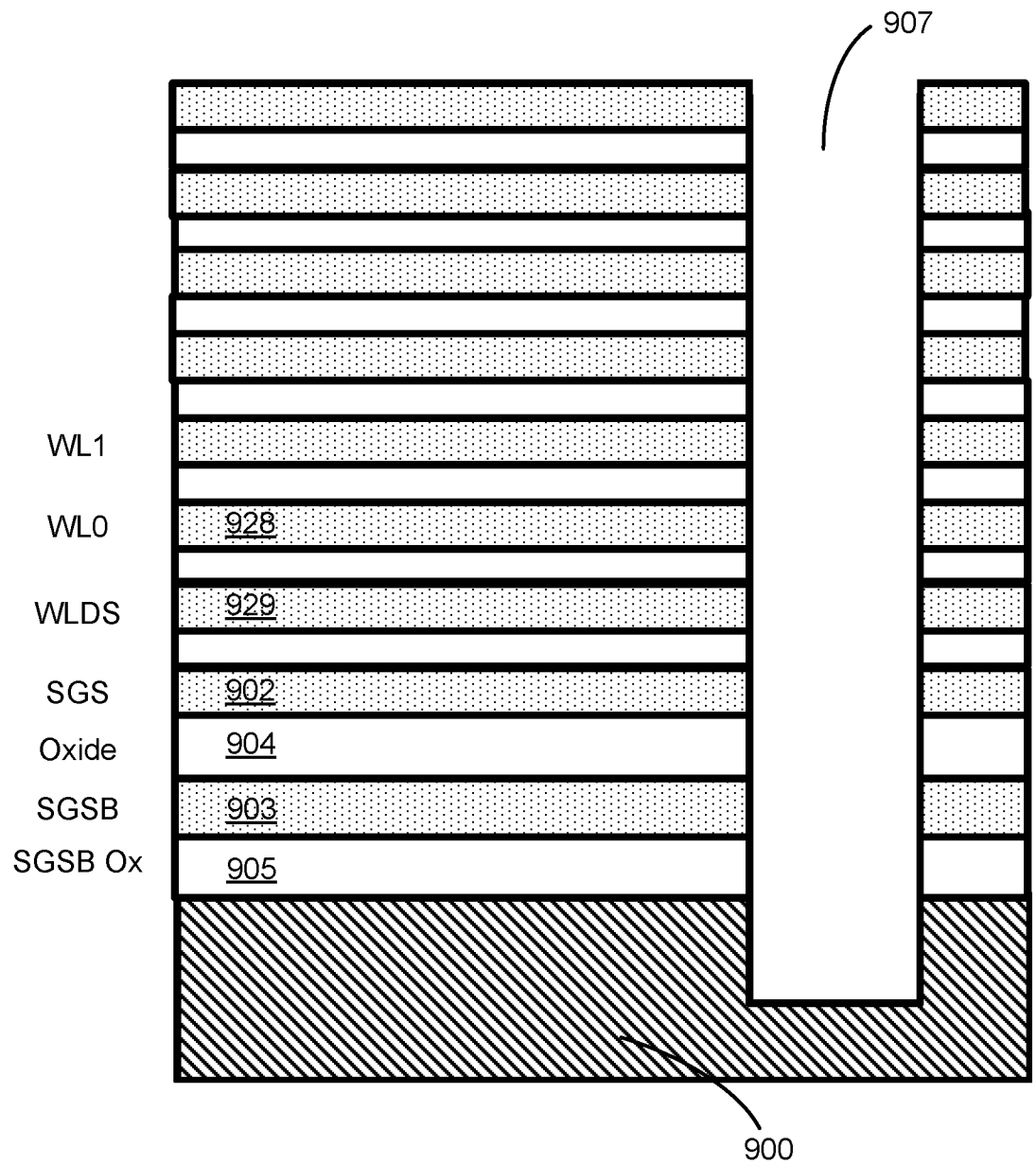
FIGS. 9A-9E depict various embodiments of stages of fabrication of a vertical NAND string using cross-sectional views and may be referred to when describing the process of FIG. 9F.
Figure 9B:
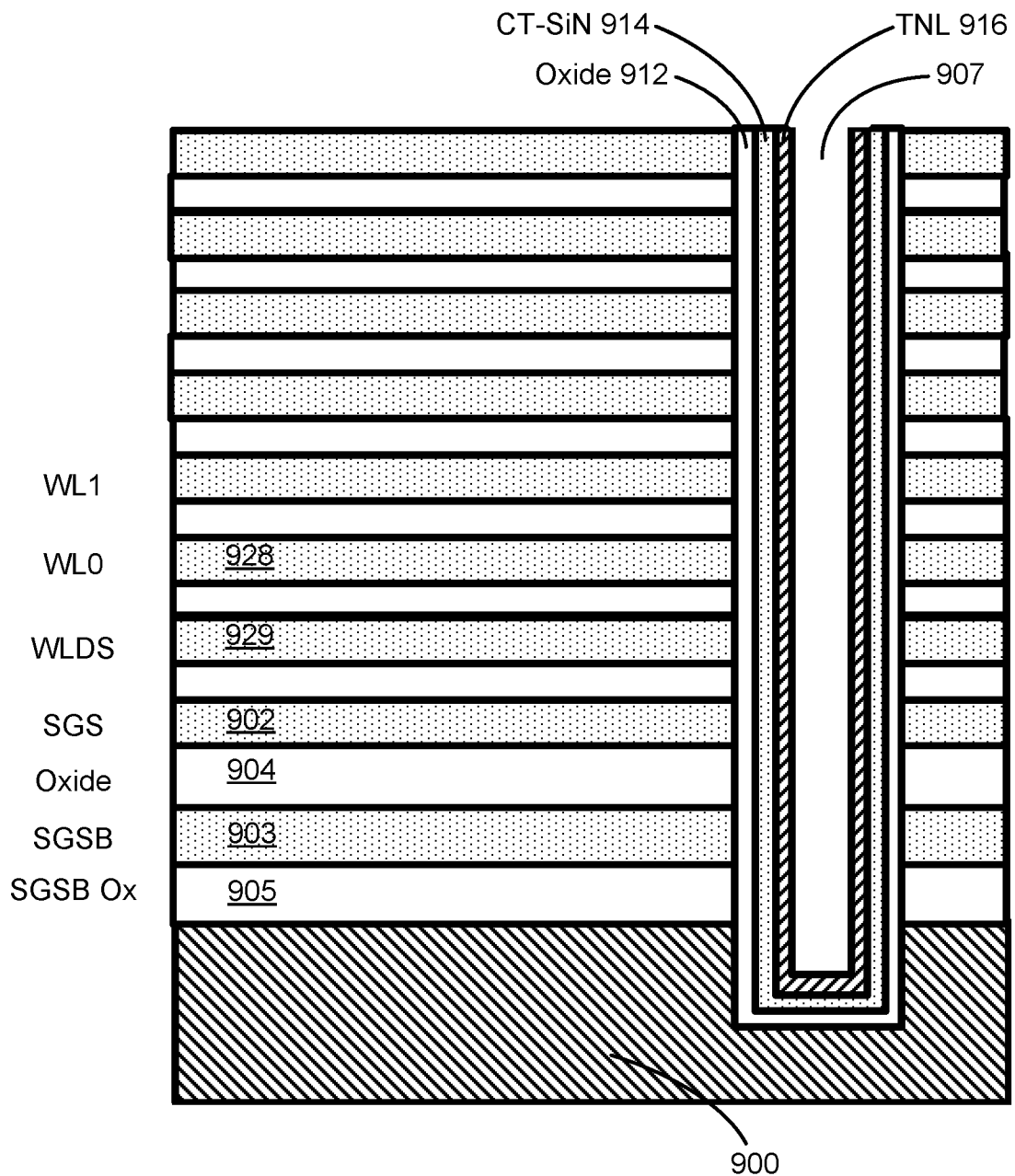
Figure 9C:
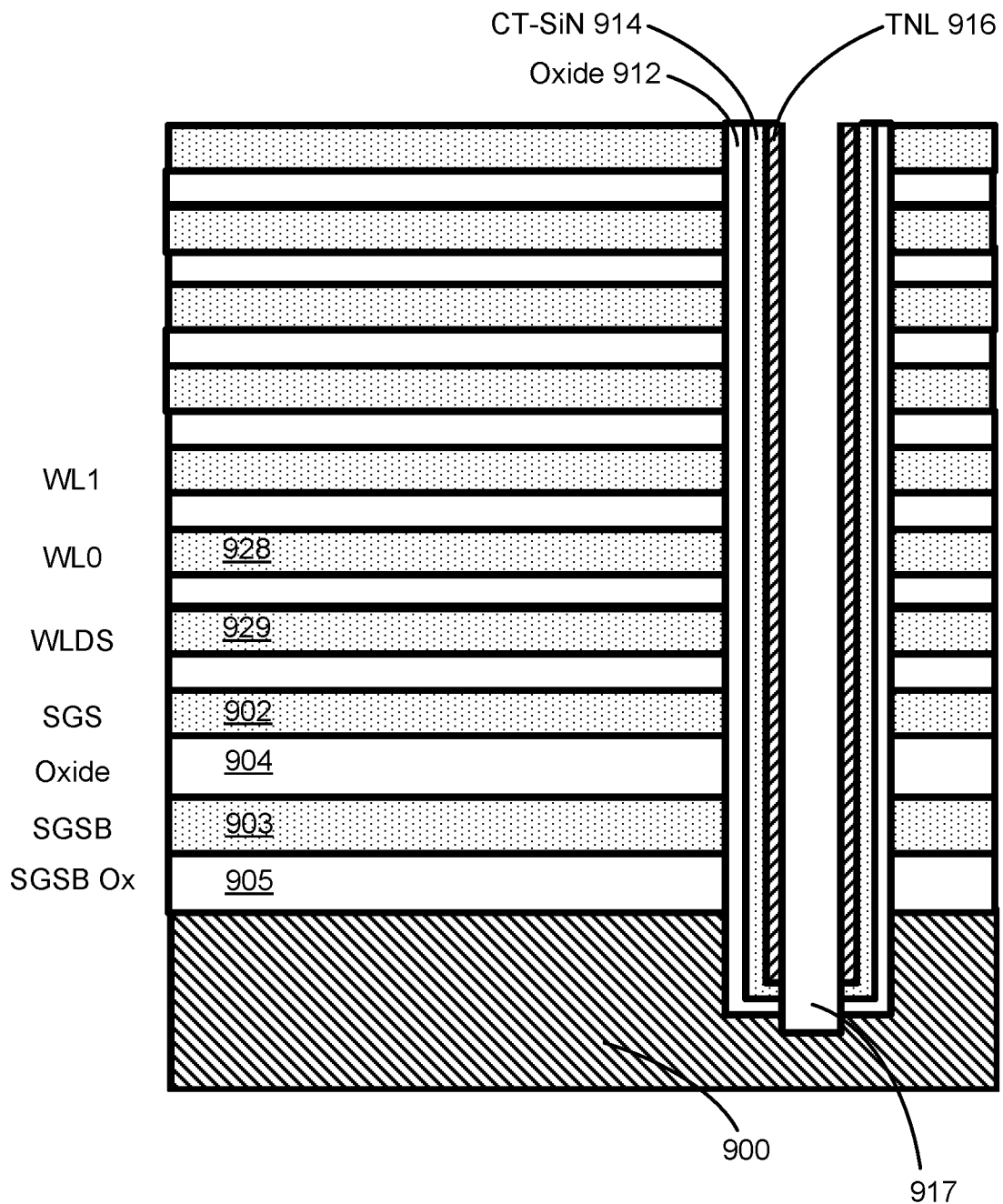
Figure 9D:
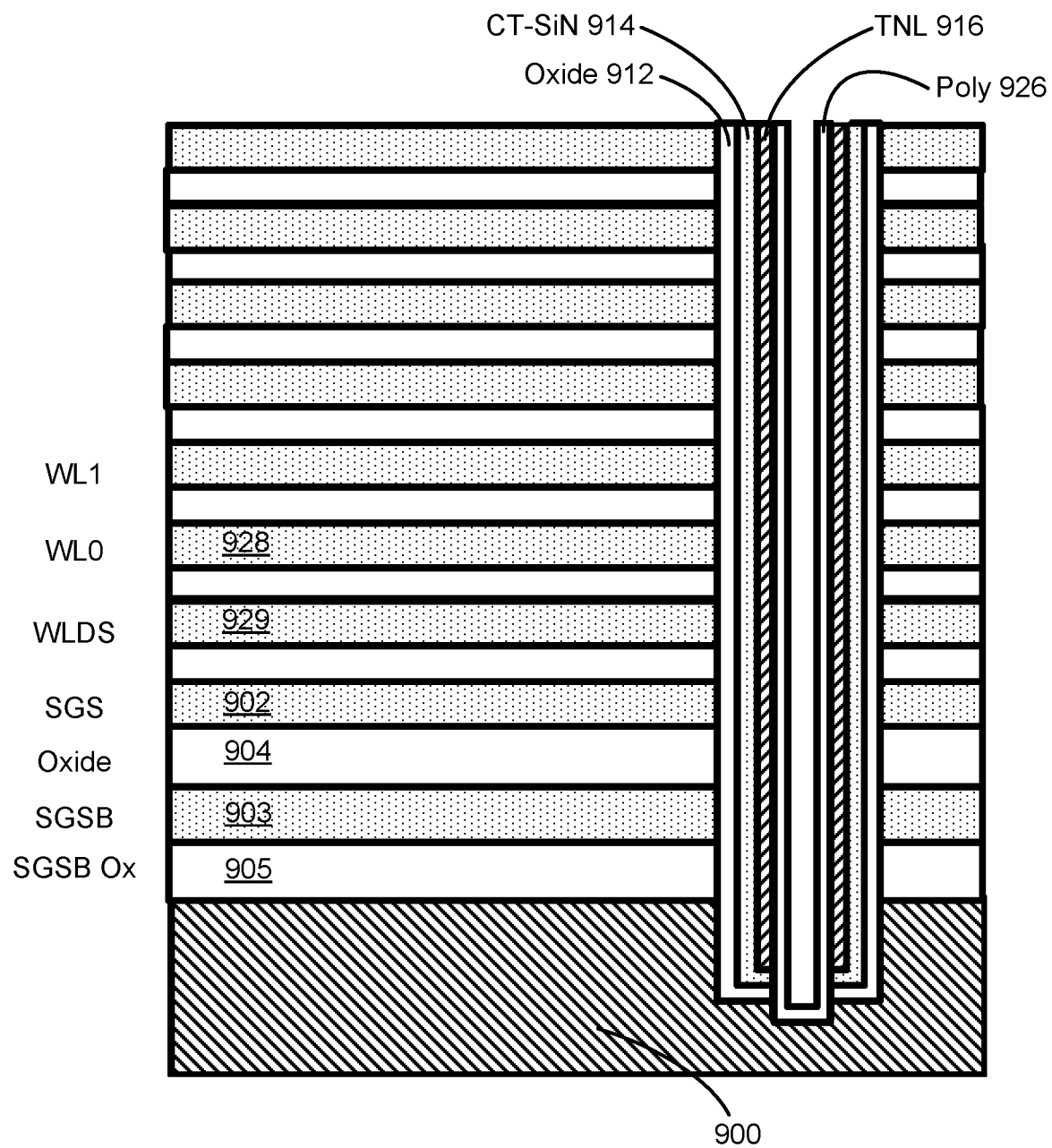
Figure 9E:
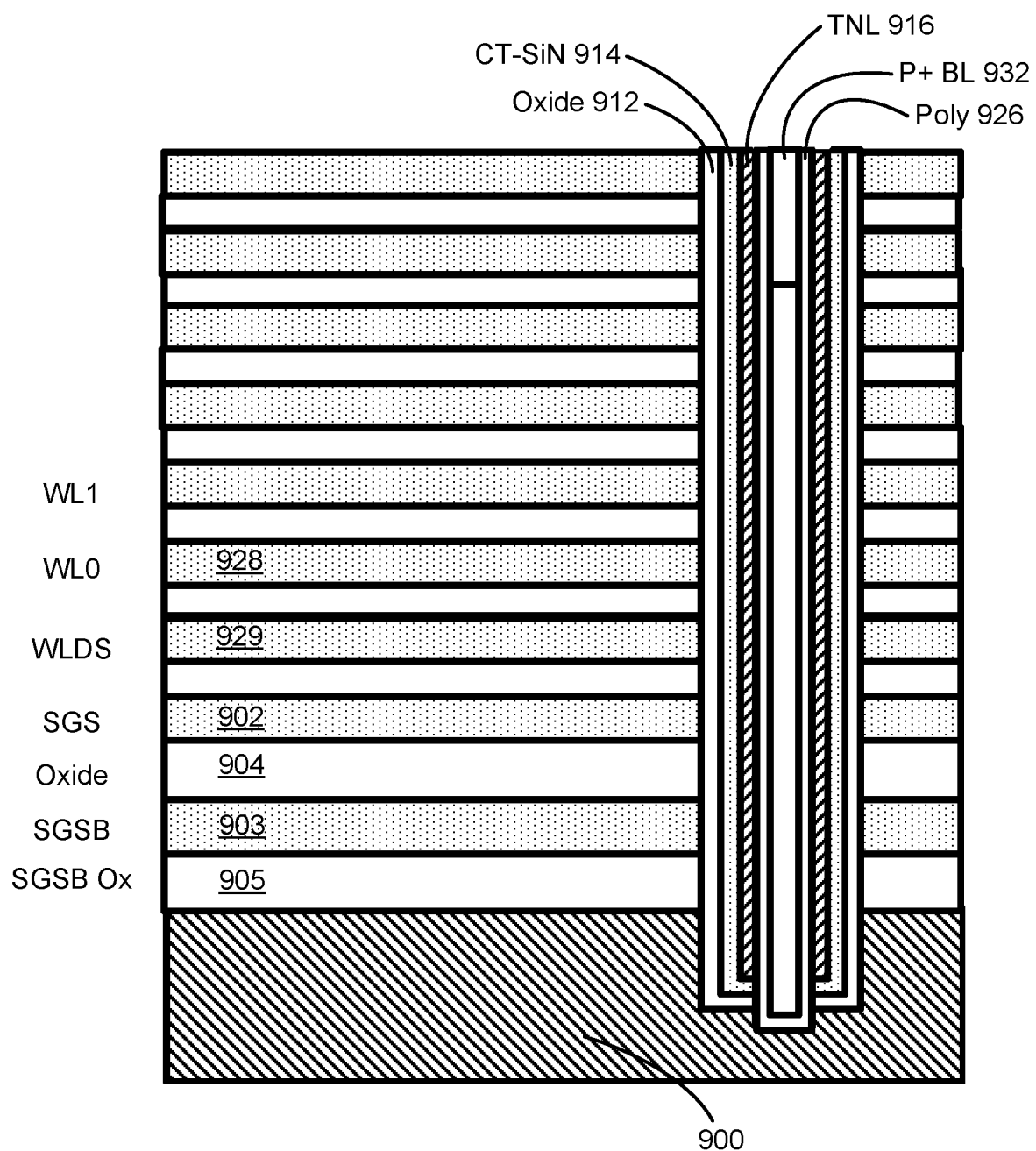
Figure 9F:
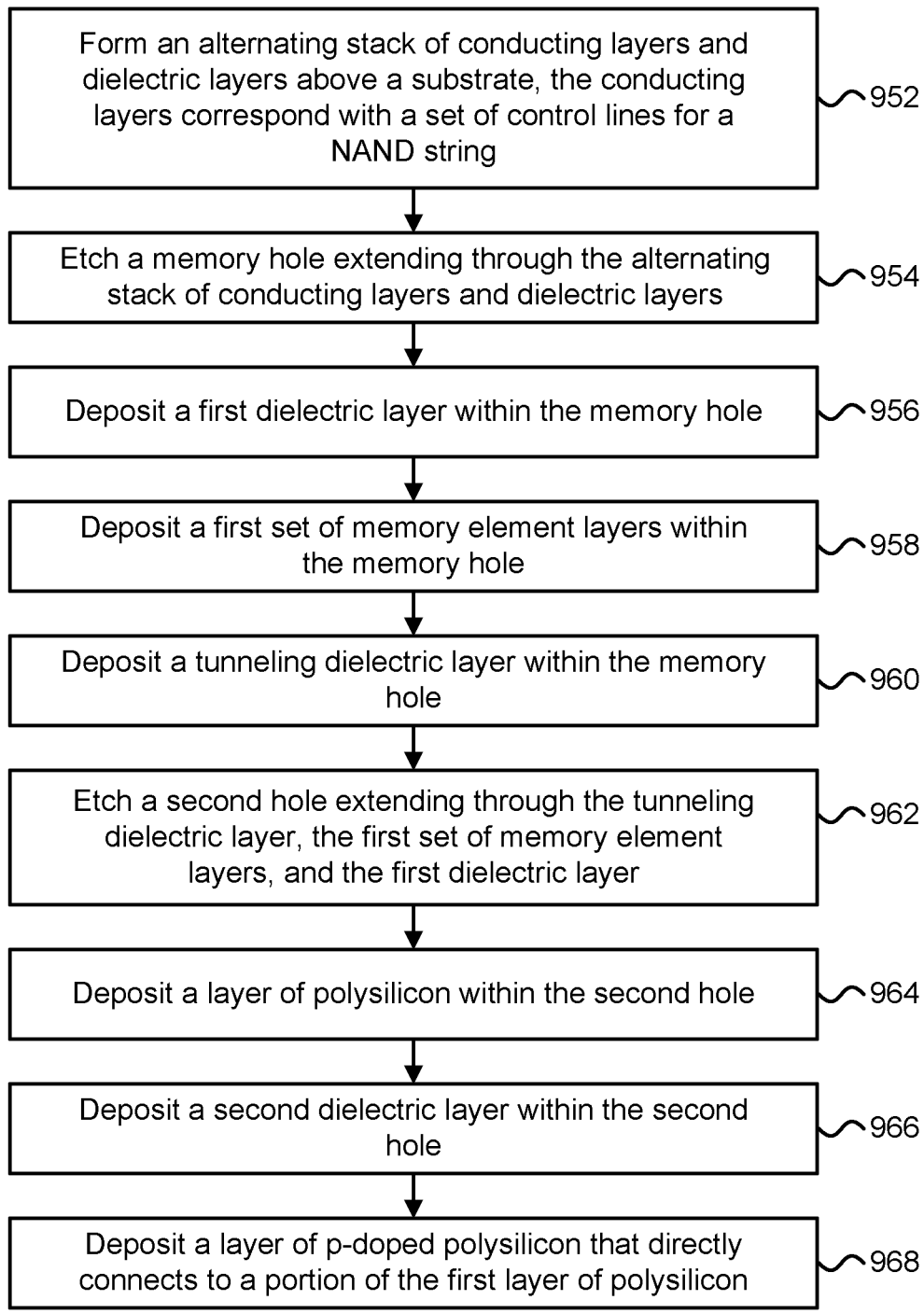
FIG. 9F depicts a flowchart describing one embodiment of a process for fabricating a vertical NAND string.

FIGS. 9A-9E depict various embodiments of stages of fabrication of a vertical NAND string using cross-sectional views and may be referred to when describing the process of FIG. 9F.

FIG. 9F depicts a flowchart describing one embodiment of a process for fabricating a vertical NAND string, such as the vertical NAND string depicted in FIG. 8C. The flowcharts may omit common processing steps (e.g., the formation of isolation regions or structures, various implant and annealing steps, the formation of vias/contacts, the formation of a passivation layer, planarization, etc.) in order to highlight the processing steps described.

In step 952 of FIG. 9F, an alternating stack of conducting layers and dielectric layers are formed above a substrate. The conducting layers may correspond with a set of control lines for a NAND string. In one example, the conducting layers may correspond with one or more word lines for controlling memory cell transistors of the NAND string and/or one or more select gate lines for controlling a source-side select gate or a drain-side select gate of the NAND string. In step 954, a memory hole is etched extending through the alternating stack of conducting layers and dielectric layers. The memory hole may extend completely through all of the conducting layers and dielectric layers and extend into a portion of a substrate or a well above which the alternating stack of conducting layers and dielectric layers were formed.

Referring to FIG. 9A, the memory hole 907 has been etched through an alternating stack of conducting layers and dielectric layers. The dielectric layers may comprise oxide layers. The conducting layers may comprise metallic layers or layers of SiN or polysilicon that are separated by oxide layers. The memory hole may be formed by patterning and then removing material using various etching techniques such as dry etching, wet chemical etching, plasma etching, or reactive-ion etching (ME). An anisotropic etch may be used to produce cutout regions with substantially vertical sidewalls. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

In some embodiments, a plurality of memory holes may be formed by etching through an alternating stack of conducting (e.g., word line layers) and dielectric layers to form the plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching.

As depicted in FIG. 9A, the conducting layers that include a first conducting layer 903 corresponding with a control line for a first source-side select gate (SGSB), a second conducting layer 902 corresponding with a control line for a second source-side select gate (SGS), a third conducting layer 929 corresponding with a control line for a dummy word line transistor (WLDS), and a fourth conducting layer 928 corresponding with the control line for a word line memory cell transistor (WL0). Arranged between and electrically separating the conducting layers are dielectric layers including oxide layer 905 and oxide layer 904. The dielectric layers may comprise a layer of silicon dioxide. The conducting layers may comprise doped polysilicon, SiN, TiN, or tungsten (W). As depicted, the alternating stack of conducting layers and dielectric layers have been formed above a substrate 900. The substrate 900 may comprise an n-type substrate or an n-type well.

In step 956 of FIG. 9F, a first dielectric layer is deposited within the memory hole. The first dielectric layer may comprise a layer of silicon dioxide. In step 958, a first set of memory element layers is deposited within the memory hole. The first set of memory element layers may include a charge trap layer. The first set of memory element layers may include a layer of silicon nitride. In step 960, a tunneling dielectric layer is deposited within the memory hole. The first dielectric layer, the first set of memory element layers, and/or the tunneling dielectric layer may be deposited using various deposition techniques such as chemical vapor deposition (CVD), physical vapor deposition (PVD), or atomic layer deposition (ALD). In some embodiments, the first set of memory element layers may comprise a charge trap material, a phase change material, a ferroelectric material, or a metal oxide such as nickel oxide or hafnium oxide. In some cases, the first set of memory element layers may have a thickness (or width) of 3 nm or a thickness between 1 nm and 4 nm.

As depicted in FIG. 9B, an oxide layer 912, a charge trap layer 914 (e.g., comprising a layer of silicon nitride), and a tunneling dielectric layer 916 have been deposited within the memory hole 907 of FIG. 9A. Each of the layers 912, 914, and 916 may be conformally deposited within the memory hole 907.

In step 962 of FIG. 9F, a second hole is etched extending through the tunneling dielectric layer, the first set of memory element layers, and the first dielectric layer. As depicted in FIG. 9C, an oxide layer 912, a charge trap layer 914, and a thin dielectric layer or a tunneling dielectric layer 916 have been deposited within the memory hole 907 of FIG. 9A and a second hole 917 has been etched extending through the oxide layer 912, the charge trap layer 914, and the tunneling dielectric layer 916. The second hole 917 may extend into a portion of the substrate 900. The oxide layer 912 may comprise a layer of silicon dioxide. The charge trap layer 914 may comprise a layer of silicon nitride. The tunneling dielectric layer 916 may comprise a thin oxide layer. In some cases, the tunneling dielectric layer may comprise one or more layers. In one example, the tunneling dielectric layer may include a multi-layer dielectric film such as an ONO dielectric stack, which includes alternating layers of silicon dioxide ("O") and silicon nitride ("N").

In some embodiments, prior to etching the second hole 917, a cover polysilicon layer not depicted may be deposited over the tunneling dielectric layer 916 in order to protect the tunneling dielectric layer 916 from damage during the subsequent etching of the second hole 917. After the cover polysilicon layer has been deposited over the tunneling dielectric layer 916, the second hole 917 may be etched (e.g., using an anisotropic etch) that extends through the cover polysilicon layer, the tunneling dielectric layer, the first set of memory element layers, and the first dielectric layer. The second hole 917 may also extend into a portion of the substrate 900. After the second hole 917 has been etched, the cover polysilicon layer may be removed prior to deposition of the channel polysilicon layer.

In step 964 of FIG. 9F, a layer of polysilicon is deposited within the second hole. As depicted in FIG. 9D, a layer of polysilicon 926 has been deposited within the second hole 917 of FIG. 9C. The layer of polysilicon 926 may comprise a channel layer for the vertical NAND string. The layer of polysilicon 926 may comprise a layer of undoped polysilicon.

In step 966 of FIG. 9F, a second dielectric layer is deposited within the second hole. In some embodiments, the second dielectric layer may comprise a layer of silicon dioxide that is deposited using various deposition techniques such as chemical vapor deposition (CVD), physical vapor deposition (PVD), or atomic layer deposition (ALD). The second dielectric layer may completely fill the second hole. In step 968, a layer of p-type doped polysilicon is deposited and directly connects to a portion of the first layer of polysilicon. The layer of p-type doped polysilicon may correspond with a bit line contact to the drain-side end of the NAND string. As depicted in FIG. 9E, a layer of p-type doped polysilicon P+BL 932 has been deposited and is directly connected to the layer of polysilicon 926.

Figure 9G:
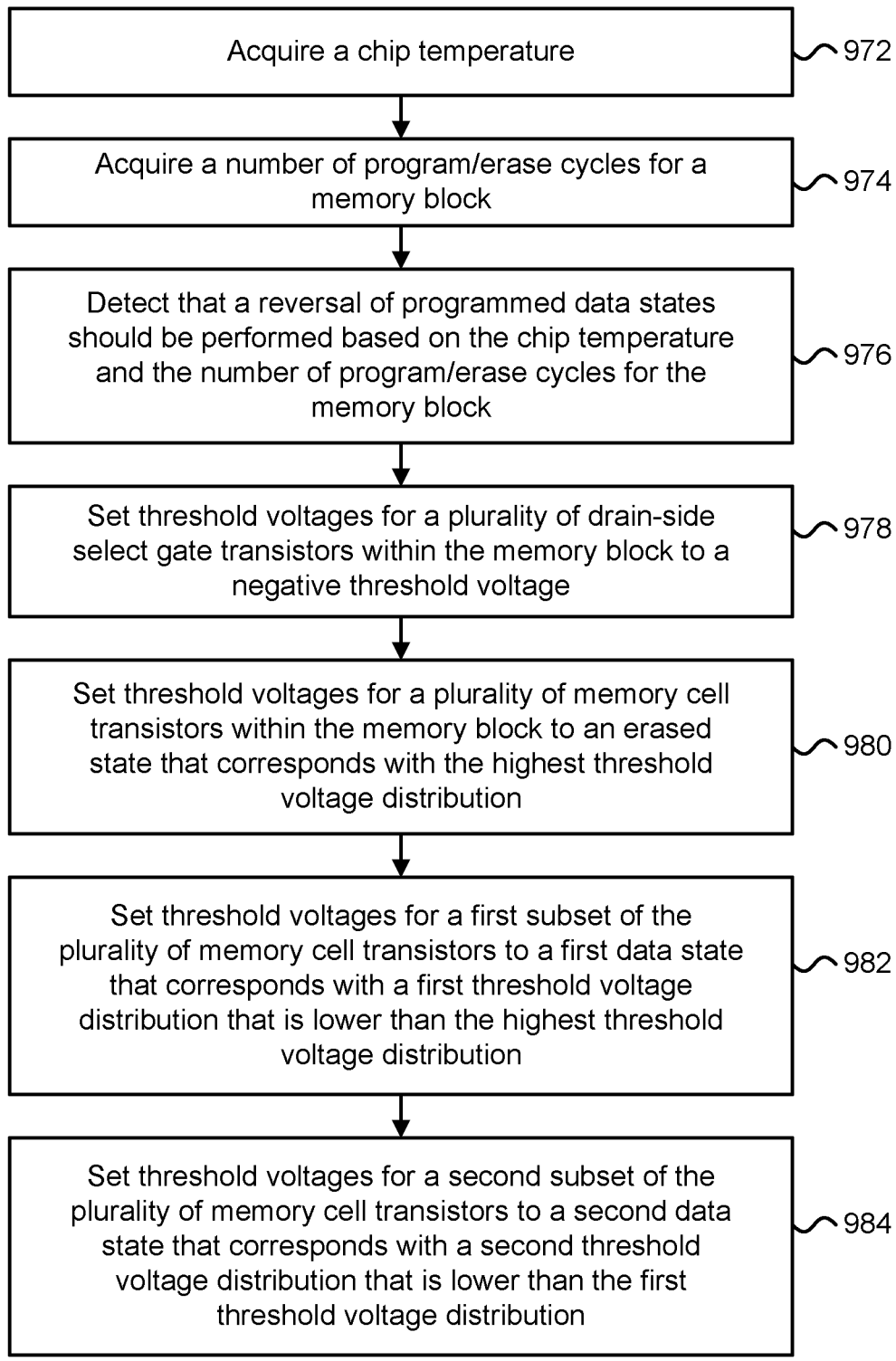
FIG. 9G depicts a flowchart describing one embodiment of a process for reducing the number of memory cell transistors that experience excessive hole injection during memory operations.

FIG. 9G depicts a flowchart describing one embodiment of a process for reducing the number of memory cell transistors that experience excessive hole injection during memory operations. The memory operations may comprise erase operations or programming operations that set the threshold voltages of memory cell transistors to be more negative than a particular negative threshold voltage (e.g., to a threshold voltage below −2V). In one embodiment, the process of FIG. 9G may be performed by control circuitry, such as control circuitry 310 depicted in FIG. 2A, and/or sensing circuitry, such as read/write circuits 328 in FIG. 2A. The process of FIG. 9G may also be performed using memory array support circuitry, such as support circuitry 711 in FIG. 7.

In step 972, a chip temperature is acquired. The chip temperature may be acquired from a temperature sensor circuit, such as the temperature sensor circuit 318 in FIG. 2A. In step 974, a number of program/erase cycles for a memory block is acquired. The memory block may include a plurality of NAND strings. The memory block may correspond with a memory array, such as the memory array 710 in FIG. 7. The number of program/erase cycles may comprise the number of times that the memory block has been erased and subsequently programmed. In step 976, it is detected that a reversal of programmed data states should be performed based on the chip temperature and the number of program/erase cycles for the memory block. In one example, if the chip temperature is greater than a threshold temperature (e.g., is greater than 45 degrees Celsius), then the next program/erase cycle will follow a reversal of the programmed data states. In another example, if the number of program/erase cycles for the memory block has exceeded a threshold number of cycles (e.g., is greater than 25 cycles), then the next program/erase cycle will follow a reversal of the programmed data states. Upon detection that a reversal of programmed data states will be performed, the memory cell transistors within the memory block may be set into an erased state that corresponds with the highest threshold voltage distribution out of all the programmed data states.

To facilitate the programming of the threshold voltages of the memory cell transistors within the memory block with a reversal of the programmed data states, each of the NAND strings within the memory block may include device structures with bit line connections comprising direct poly-channel contact to P+ silicon and source line connections comprising direct poly-channel contact to N+ silicon. As the interface between the NAND string poly-channel and the bit line connection comprises P+ silicon, setting the threshold voltages of the drain-side select gates to a negative threshold voltage (e.g., −2V) may increase the barrier for holes from the P+ silicon within unselected NAND strings.

In step 978, the threshold voltages of a plurality of drain-side select gate transistors within the memory block are set to a negative threshold voltage. In one embodiment, prior to performing the reversal of programmed data states, a control circuit, such as control circuitry 310 in FIG. 2A, may cause the threshold voltages of the drain-side select gate transistors within the memory block to be set to the negative threshold voltage (e.g., to −2V). The determination of the negative threshold voltage may depend on the read voltage applied to bit lines during read operations. In one example, the negative threshold voltage of the drain-side select gate transistors may be set to the negative of the read voltage (e.g., if the read voltage is 2V, then the negative threshold voltage of the drain-side select gate transistors will be set to −2V).

In step 980, the threshold voltages for a plurality of memory cell transistors within the memory block are set to an erased state that corresponds with the highest threshold voltage distribution out of all of the programmed data states. In reference to FIG. 8B, the threshold voltages for the plurality of memory cell transistors may be set to the erased state distribution Er. In step 982, the threshold voltages for a first subset of the plurality of memory cell transistors are set to a first data state that corresponds with a first threshold voltage distribution that is lower than the highest threshold voltage distribution. In reference to FIG. 8B, the threshold voltages for the first subset of the plurality of memory cell transistors may be set to the C-state voltage distribution. In step 984, the threshold voltages for a second subset of the plurality of memory cell transistors different from the first subset are set to a second data state that corresponds with a second threshold voltage distribution that is lower than the first threshold voltage distribution. In reference to FIG. 8B, if the first threshold voltage distribution comprises the C-state voltage distribution, then the second threshold voltage distribution may comprise the F-state voltage distribution.

Figure 9H:
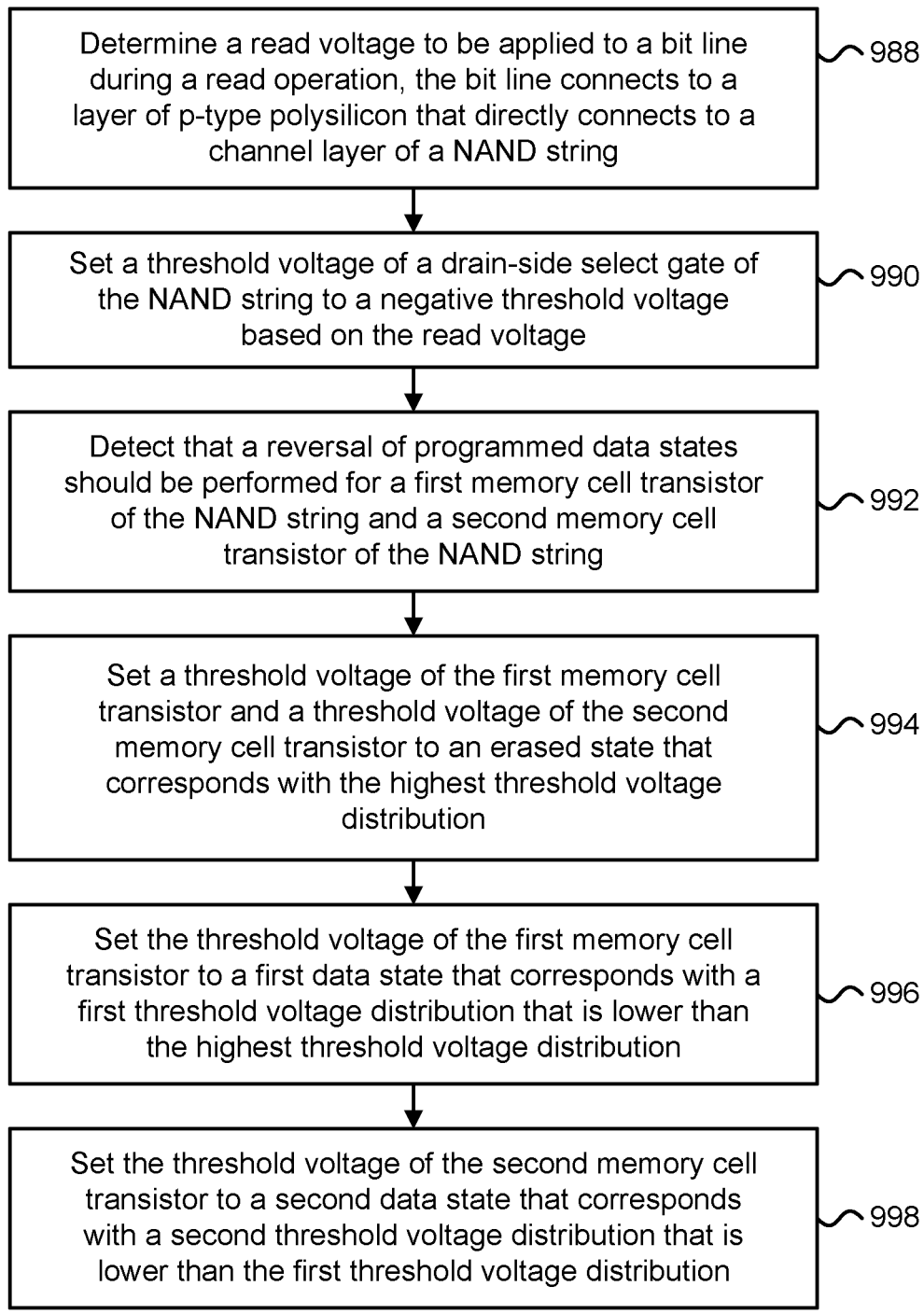
FIG. 9H depicts a flowchart describing another embodiment of a process for reducing the number of memory cell transistors that experience excessive hole injection during memory operations.

FIG. 9H depicts a flowchart describing another embodiment of a process for reducing the number of memory cell transistors that experience excessive hole injection during memory operations. The memory operations may comprise erase operations or programming operations that set the threshold voltages of memory cell transistors to be more negative than a particular negative threshold voltage (e.g., to a threshold voltage below −1V). In one embodiment, the process of FIG. 9H may be performed by control circuitry, such as control circuitry 310 depicted in FIG. 2A, and/or sensing circuitry, such as read/write circuits 328 in FIG. 2A. The process of FIG. 9H may also be performed using memory array support circuitry, such as support circuitry 711 in FIG. 7.

In step 988, a read voltage to be applied to a bit line during a read operation is determined. The bit line may connect to a layer of p-type polysilicon that directly connects to a channel layer of a NAND string. In one example, the layer of p-type polysilicon may correspond with the doped polysilicon layer P+BL 932 in FIG. 9E and the channel layer of the NAND string may correspond with layer of polysilicon Poly 926 in FIG. 9E. The channel layer of the NAND string may comprise a layer of undoped polysilicon. In step 990, a threshold voltage of a drain-side select gate of the NAND string is set to a negative threshold voltage based on the read voltage. In one example, the negative threshold voltage may comprise the negative of the read voltage (e.g., if the read voltage was determined to be 1.5V, then the negative threshold voltage may be set to −1.5V).

In step 992, it is detected that a reversal of programmed data states should be performed for a first memory cell transistor of the NAND string and for a second memory cell transistor of the NAND string. In one embodiment, it may be detected that the reversal of the programmed data states should be performed in response to detecting that a chip temperature has exceeded a threshold temperature (e.g., is greater than 55 degrees Celsius). In step 994, a threshold voltage of the first memory cell transistor and a threshold voltage of the second memory cell transistor are set to an erase state that corresponds with the highest threshold voltage distribution. In this case, both the first memory cell transistor and the second memory cell transistor may be set to the erased state during an erase operation. In reference to FIG. 8B, the erased state a correspond with the erased state distribution Er.

In step 996, the threshold voltage of the first memory cell transistor is set to a first data state that corresponds with a first threshold voltage distribution that is lower than the highest threshold voltage distribution. In reference to FIG. 8B, the first threshold voltage distribution may comprise the B-state threshold voltage distribution. In step 998, the threshold voltage of the second memory cell transistor is set to a second data state that corresponds with a second threshold voltage distribution that is lower than the first threshold voltage distribution. In reference to FIG. 8B, if the first threshold voltage distribution comprises the B-state threshold voltage distribution, then the second threshold voltage distribution may comprise the C-state threshold voltage distribution.

One embodiment of the disclosed technology includes forming an alternating stack of conducting layers and dielectric layers above a substrate, etching a memory hole extending through the alternating stack of conducting layers and dielectric layers, depositing a first dielectric layer within the memory hole, depositing one or more memory element layers within the memory hole, depositing a tunneling dielectric layer within the memory hole, etching a second hole extending through the tunneling dielectric layer, the one or more memory element layers, and the first dielectric layer, depositing a layer of polysilicon within the second hole, depositing a second dielectric layer within the second hole, and depositing a layer of p-type polysilicon that directly contacts a portion of the first layer of polysilicon.

One embodiment of the disclosed technology includes one or more control circuits configured to detect that a reversal of programmed data states should apply to a plurality of memory cell transistors and set threshold voltages for the plurality of memory cell transistors to an erased state that corresponds with the highest threshold voltage distribution for the programmed data states. The one or more control circuits are configured to set threshold voltages for a first subset of the plurality of memory cell transistors to a first data state that corresponds with a first threshold voltage distribution that is lower than the highest threshold voltage distribution and set threshold voltages for a second subset of the plurality of memory cell transistors to a second data state that corresponds with a second threshold voltage distribution that is lower than the first threshold voltage distribution.

One embodiment of the disclosed technology includes a NAND string including a plurality of memory cell transistors and one or more control circuits. The NAND string includes a polysilicon channel that directly contacts at least a portion of a p-type polysilicon bit line. The one or more control circuits are configured to detect that a reversal of programmed data states should be performed during subsequent programming of the plurality of memory cell transistors. The one or more control circuits are configured to set a threshold voltage of a first memory cell transistor of the plurality of memory cell transistors to an erased state that corresponds the highest threshold voltage distribution for the programmed data states and set a threshold voltage of a second memory cell transistor of the plurality of memory cell transistors to the erased state in response to detection that the reversal of programmed data states should be performed during subsequent programming of the plurality of memory cell transistors. The one or more control circuits are configured to set the threshold voltage of the first memory cell transistor to a first data state that corresponds with a first threshold voltage distribution that is lower than the highest threshold voltage distribution and set the threshold voltage of the second memory cell transistor to a second data state that corresponds with a second threshold voltage distribution that is lower than the first threshold voltage distribution.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

Two devices may be "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
one or more control circuits configured to detect that a reversal of programmed data states is to be applied to a plurality of memory cell transistors and set threshold voltages for the plurality of memory cell transistors to an erased state that corresponds with a highest threshold voltage distribution for the programmed data states, the one or more control circuits are configured to set threshold voltages for a first subset of the plurality of memory cell transistors to a first data state that corresponds with a first threshold voltage distribution that is lower than the highest threshold voltage distribution and set threshold voltages for a second subset of the plurality of memory cell transistors to a second data state that corresponds with a second threshold voltage distribution that is lower than the first threshold voltage distribution.

2. The apparatus of claim 1, wherein:
the one or more control circuits are configured to acquire a chip temperature and detect that the reversal of programmed data states is to be performed based on the chip temperature.

3. The apparatus of claim 1, wherein:
the plurality of memory cell transistors is arranged within a memory block; and
the one or more control circuits are configured to acquire a number of program/erase cycles for the memory block and detect that the reversal of programmed data states is to be performed based on the number of program/erase cycles for the memory block.

4. The apparatus of claim 1, wherein:
the plurality of memory cell transistors is arranged within a memory block; and
the one or more control circuits are configured to set threshold voltages for a plurality of drain-side select gate transistors within a second memory block to a negative threshold voltage prior to the first subset of the plurality of memory cell transistors being set to the first data state.

5. The apparatus of claim 4, wherein:
the one or more control circuits are configured to determine a read voltage and set the threshold voltages for the plurality of drain-side select gate transistors within the second memory block to the negative threshold voltage based on the read voltage.

6. The apparatus of claim 1, wherein:
the plurality of memory cell transistors are part of a NAND string that includes a polysilicon channel that is directly connected to a p-type doped polysilicon bit line.

7. The apparatus of claim 1, wherein:
the plurality of memory cell transistors comprises charge trap transistors.

8. An apparatus, comprising:
a NAND string including a plurality of memory cell transistors, the NAND string includes a polysilicon channel that directly contacts at least a portion of a p-type polysilicon bit line; and
one or more control circuits configured to detect that a reversal of programmed data states is to be performed during subsequent programming of the plurality of memory cell transistors, the one or more control circuits are configured to set a threshold voltage of a first memory cell transistor of the plurality of memory cell transistors to an erased state that corresponds with a highest threshold voltage distribution for the programmed data states and set a threshold voltage of a second memory cell transistor of the plurality of memory cell transistors to the erased state in response to detection that the reversal of programmed data states is to be performed during subsequent programming of the plurality of memory cell transistors, the one or more control circuits are configured to set the threshold voltage of the first memory cell transistor to a first data state that corresponds with a first threshold voltage distribution that is lower than the highest threshold voltage distribution and set the threshold voltage of the second memory cell transistor to a second data state that corresponds with a second threshold voltage distribution that is lower than the first threshold voltage distribution.

9. The apparatus of claim 8, wherein:
the one or more control circuits are configured to determine a read voltage to be applied to the p-type polysilicon bit line during a read operation and set a threshold voltage of a drain-side select gate of a second NAND string different from the NAND string to a negative threshold voltage based on the read voltage.

10. The apparatus of claim 8, wherein:
the NAND string resides within a selected memory block and the second NAND string resides within an unselected memory block.

11. The apparatus of claim 8, wherein:
the one or more control circuits are configured to acquire a chip temperature and detect that the reversal of programmed data states is to be performed based on the chip temperature.

12. The apparatus of claim 8, wherein:
the one or more control circuits are configured to acquire a number of program/erase cycles for the NAND string and detect that the reversal of programmed data states is to be performed based on the number of program/erase cycles for the NAND string.

13. The apparatus of claim 8, wherein:
the plurality of memory cell transistors comprises floating gate transistors.

14. The apparatus of claim 8, wherein:
the NAND string is arranged on a first die; and
the one or more control circuits are arranged on a second die.

15. The apparatus of claim 8, wherein:
the one or more control circuits are configured to set the threshold voltage of the first memory cell transistor to the first data state by adjusting the threshold voltage of the first memory cell transistor during a programming operation.

* * * * *